United States Patent
Marra et al.

(10) Patent No.: US 10,834,513 B1
(45) Date of Patent: Nov. 10, 2020

(54) METHOD FOR USE OF A CALIBRATION SYSTEM FOR CALIBRATION OF A SPEAKERPHONE SYSTEM UTILIZING A SEPARATE CALIBRATION DEVICE

(71) Applicant: Crestron Electronics, Inc., Rockleigh, NJ (US)

(72) Inventors: Alexander Marra, Ridgewood, NJ (US); Mark Hrozenchik, Norwalk, CT (US)

(73) Assignee: Crestron Electronics, Inc., Rockliegh, NJ (US)

(*) Notice: Subject to any disclaimer, the term of this patent is extended or adjusted under 35 U.S.C. 154(b) by 0 days.

(21) Appl. No.: 16/572,004

(22) Filed: Sep. 16, 2019

(51) Int. Cl.
*H04R 29/00* (2006.01)
*G01R 31/28* (2006.01)
*H04R 3/04* (2006.01)

(52) U.S. Cl.
CPC ....... *H04R 29/001* (2013.01); *G01R 31/2825* (2013.01); *H04R 3/04* (2013.01)

(58) Field of Classification Search
CPC .... H04R 29/001; H04R 3/04; G01R 31/2825; G10K 11/17825; G10K 11/17875; G10K 2210/108; G10K 2210/3026; G10K 2210/3211; H04L 12/46
See application file for complete search history.

(56) References Cited

U.S. PATENT DOCUMENTS

2014/0363008 A1* 12/2014 Chen .................... G10K 11/002
  381/66
2018/0077507 A1* 3/2018 Bernal Castillo ........ H04R 3/00

* cited by examiner

*Primary Examiner* — Andrew L Sniezek
(74) *Attorney, Agent, or Firm* — Crestron Electronics, Inc.

(57) ABSTRACT

A method for calibrating a speakerphone system under test is provided herein, comprising: connecting a calibration unit to the speakerphone system under test (SSUT) via a communications interface, and wherein the SSUT further comprises a loudspeaker, microphone (mic), and mechanical vibration sensor (MVS); generating a first test signal by the calibration unit and transmitting the same to the SSUT; generating a first set of mechanical vibrations in response to the first test signal in the SSUT; and determining a calibration factor in regard to the first test signal and first set of mechanical vibrations by the calibration unit.

18 Claims, 8 Drawing Sheets

400

METHOD FOR USE OF A CALIBRATION SYSTEM FOR CALIBRATION OF A SPEAKERPHONE SYSTEM UTILIZING A SEPARATE CALIBRATION DEVICE

CROSS REFERENCE TO RELATED APPLICATIONS

Related subject matter is disclosed in co-pending U.S. Non-provisional patent application Ser. No. 16/571,439, filed Sep. 16, 2019; U.S. Non-provisional patent application Ser. No. 16/571,498, filed Sep. 16, 2019; U.S. Non-provisional patent application Ser. No. 16/571,667, filed Sep. 16, 2019; U.S. Non-provisional patent application Ser. No. 16/571,770, filed Sep. 16, 2019; and U.S. Non-provisional patent application Ser. No. 16/571,894 filed Sep. 16, 2019, the entire contents of all of which are expressly incorporated herein by reference.

BACKGROUND

Technical Field

The embodiments described herein relate generally to speakerphone systems, and more specifically to systems, methods, and modes for substantially or completely eliminating mechanical vibration energy from a loudspeaker in the speakerphone that is converted to acoustical signals that can be acquired by a microphone as an error signal in the speakerphone.

Background Art

There are many different types of speakerphone systems currently being used today in the home, office, and other enterprise locations. Many of these currently available systems include at least one loudspeaker and at least microphone in the same package. Unfortunately speakers, by there very nature, vibrate when electrical signals are applied to the magnetic transducer and the cone moves to replicate as sound waves the electrical signals that were received. In some cases, the vibrations can be transferred to the package or case in which the speakerphone system is enclosed, and the at least one microphone can acquire such mechanical vibrations and convert them to electrical sound signals. Since these acoustical signals are not true voice signals, they are noise, and degrade the performance of the speakerphone system.

Accordingly, a need has arisen for systems, methods, and modes for substantially or completely eliminating mechanical vibration energy from the loudspeaker that is converted to acoustical signals that can be acquired by a microphone as an error signal in the speakerphone.

SUMMARY

It is an object of the embodiments to substantially solve at least the problems and/or disadvantages discussed above, and to provide at least one or more of the advantages described below.

It is therefore a general aspect of the embodiments to provide systems, methods, and modes for substantially or completely eliminating mechanical vibration energy from the loudspeaker that is converted to acoustical signals that can be acquired by a microphone as an error signal in the speakerphone that will obviate or minimize problems of the type previously described.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

According to a first aspect of the embodiments, a speakerphone system is provided, comprising: at least one mechanical vibration sensor adapted to convert mechanical vibrations in a speakerphone enclosure (enclosure) to a mechanical vibration error signal, and output the same as an MVS output signal; at least one microphone adapted to convert an input sound acoustic signal into an input sound electrical signal and to output the same as a mic output signal; and circuitry adapted to subtract the MVS output signal from the mic output signal and output the resultant signal as a speakerphone output signal.

According to the first aspect of the embodiments the circuitry comprises: a first receiver adapted to receive the output of the MVS; a second receiver adapted to receive the output of the mic; and additional circuitry adapted to perform the subtraction of the MVS output signal from the mic output signal.

According to the first aspect of the embodiments system further comprises: a first analog to digital converter adapted to digitize an output of the first receiver, and forward the same to the additional circuitry; and a second analog to digital converter adapted to digitize an output of the second receiver, and forward the same to the additional circuitry.

According to the first aspect of the embodiments the additional circuitry comprises: a signal processor adapted to perform the subtraction of the MVS output signal from the mic output signal.

According to the first aspect of the embodiments the additional circuitry comprises: analog circuitry adapted to perform the subtraction of the MVS output signal from the mic output signal.

According to the first aspect of the embodiments the first receiver comprises: a first analog signal line receiver adapted to receive the output of the MVS; an amplifier adapted to amplify substantially only audio frequency signals; and a filter adapted to pass substantially only audio frequency signals.

According to the first aspect of the embodiments the second receiver comprises: a second analog signal line receiver adapted to receive the output of the mic; an amplifier adapted to amplify substantially only audio frequency signals; and a filter adapted to pass substantially only audio frequency signals.

According to the first aspect of the embodiments the MVS is one of a mic, an accelerometer, and a microelectromechanical system (MEMs) integrated accelerometer.

According to the first aspect of the embodiments wherein the system further comprises: at least one loudspeaker adapted to generate an output sound that is broadcast into a volume of space exterior to that of the enclosure, and wherein the broadcast output sound generates the mechanical vibrations on the enclosure.

According to the first aspect of the embodiments wherein the at least one loudspeaker is further adapted to generate backscatter sound that is broadcast into a volume of space within the enclosure, and wherein the mechanical vibrations are generated through a combination of the output sound broadcast externally to the enclosure and the backscatter sound broadcast into the volume of the enclosure.

According to the first aspect of the embodiments wherein the circuitry is further adapted to store a plurality of calibration factors comprising—$\alpha$, an input-to-output transformation coefficient for acoustic sound signals in regard to the mic (mic acoustic transformation coefficient/calibration factor), $\beta$, an input-to-output transformation coefficient for mechanical vibration signals generated by a loudspeaker in regard to the mic (mic vibration transformation coefficient/calibration factor), $\gamma$, an input-to-output transformation coefficient for acoustic sound signals in regard to the MVS (MVS acoustic transformation coefficient/calibration factor), and $\delta$, an input-to-output transformation coefficient for mechanical vibration signals generated by the loudspeaker in regard to the MVS (MVS vibration transformation coefficient/calibration factor).

According to the first aspect of the embodiments the system further comprises: a first network interface adapted to bidirectionally communicate with the circuitry of the speakerphone and one or more external devices; and an external calibration apparatus adapted to calibrate the system and generate the plurality of calibration factors.

According to the first aspect of the embodiments wherein the external calibration apparatus comprises: a calibration loudspeaker; a second network interface adapted to bidirectionally communicate with the first network interface; a processor circuit that includes a memory device; a communications circuit adapted to facilitate transfers of data and commands between the processor circuit, the memory device, and the second network interface; and a first signal generator adapted to generate one or more acoustic audio test signals that can be broadcast by the calibration loudspeaker and received by the mic and the MVS, and further wherein the processor circuit is adapted to determine the transformation coefficients $\alpha$ and $\gamma$ based on data generated by the generated one or more acoustic audio test signals.

According to the first aspect of the embodiments wherein the external calibration apparatus further comprises: a second signal generator adapted to generate one or more electrical audio test signals that can be broadcast by the at least one loudspeaker in the speakerphone that generate test mechanical vibrations that are received by the mic and MVS, and further wherein the processor circuit is adapted to determine the transformation coefficients $\beta$ and $\delta$ based on data generated by the generated test mechanical vibration signals.

According to the first aspect of the embodiments wherein the one or more external devices comprise one or more devices interconnected with the system by one or more of a local area network, a wide area network, an Internet, a cellular communications network, a satellite communications network, a landline network, and a dedicated speakerphone network.

According to the first aspect of the embodiments the one or more devices includes one or more of a speakerphone system and a server computer.

According to the first aspect of the embodiments an output of the mic in regard to an input of an acoustic sound signal can be characterized by the application of the transfer coefficient $\alpha$ to the input acoustic sound signal, an output of the MVS in regard to an input of a mechanical vibration signal generated by the loudspeaker can be characterized by the application of the transfer coefficient $\beta$ to the input mechanical vibration signal, an output of the MVS in regard to an input of the acoustic sound signal can be characterized by the application of the transfer coefficient $\gamma$ to the input acoustic sound signal, and an output of the mic in regard to an input of the mechanical vibration signal generated by the loudspeaker can be characterized by the application of the transfer coefficient $\delta$ to the mechanical vibrations signal.

According to a second aspect of the embodiments. a speakerphone system is provided, comprising: at least one loudspeaker, the loudspeaker adapted to generate mechanical vibrations on an enclosure of the system; at least one microphone (mic) adapted to convert an input sound acoustic signal into an input sound electrical signal and adapted to convert the mechanical vibrations into a mechanical vibrations electrical signal, and to output both of the input sound electrical signal and the mechanical vibrations electrical signal as a mic output signal; at least one mechanical vibration sensor (MVS) adapted to convert the mechanical vibrations to a mechanical vibration error signal to output the mechanical vibration error signal as an MVS output signal; and circuitry adapted to subtract the MVS output signal from the mic output signal and output the resultant signal as a speakerphone output signal.

According to the second aspect of the embodiments the circuitry comprises: a first receiver adapted to receive the output of the mechanical vibration sensor; a second receiver adapted to receive the output of the mic; and additional circuitry adapted to perform the subtraction of the MVS output signal from the mic output signal.

According to the second aspect of the embodiments the system further comprises: a first analog to digital converter adapted to digitize an output of the first receiver, and forward the same to the additional circuitry; and a second analog to digital converter adapted to digitize an output of the second receiver, and forward the same to the additional circuitry.

According to the second aspect of the embodiments the additional circuitry comprises: a digital signal processor adapted to perform the subtraction of the MVS output signal from the mic output signal.

According to the second aspect of the embodiments the additional circuitry comprises: analog circuitry adapted to perform the subtraction of the MVS output signal from the mic output signal.

According to the second aspect of the embodiments the first receiver comprises: a first analog signal line receiver adapted to receive the output of the MVS; an amplifier adapted to amplify substantially only audio frequency signals; and a filter adapted to pass substantially only audio frequency signals.

According to the second aspect of the embodiments the second receiver comprises: a second analog signal line receiver adapted to receive the output of the mic; an amplifier adapted to amplify substantially only audio frequency signals; and a filter adapted to pass substantially only audio frequency signals.

According to the second aspect of the embodiments the MVS is one of a mic, an accelerometer, and a microelectromechanical system (MEMs) integrated accelerometer.

According to the second aspect of the embodiments the at least one loudspeaker is adapted to generate an output sound that is broadcast into a volume of space exterior to that of the enclosure, and wherein the broadcast output sound generates the mechanical vibrations on the enclosure.

According to the second aspect of the embodiments the at least one loudspeaker is further adapted to generate backscatter sound that is broadcast into a volume of space within the enclosure, and wherein the mechanical vibrations are generated through a combination of the output sound broadcast externally to the enclosure and the backscatter sound broadcast into the volume of the enclosure.

According to the second aspect of the embodiments the circuitry is further adapted to store a plurality of calibration factors comprising—α, an input-to-output transformation coefficient for acoustic sound signals in regard to the mic (mic acoustic transformation coefficient/calibration factor), β, an input-to-output transformation coefficient for mechanical vibration signals generated by a loudspeaker in regard to the mic (mic vibration transformation coefficient/calibration factor), γ, an input-to-output transformation coefficient for acoustic sound signals in regard to the MVS (MVS acoustic transformation coefficient/calibration factor), and δ, an input-to-output transformation coefficient for mechanical vibration signals generated by the loudspeaker in regard to the MVS (MVS vibration transformation coefficient/calibration factor).

According to the second aspect of the embodiments the circuitry is further adapted to receive a far end audio signal prior to being broadcast by the at least one loudspeaker, and wherein the circuitry is further adapted to generate the speakerphone output signal according to the following equation—second speakerphone output signal=((MIC output signal-(β×far end audio signal))-MVS output signal)/α.

According to the second aspect of the embodiments the MVS is further adapted to convert the input sound acoustic signal into an input sound error signal (126"), and to output both the mechanical vibration error signal and the input sound error signal as an MVS output signal.

According to the second aspect of the embodiments the circuitry is further adapted to receive a far end audio signal prior to being broadcast by the at least one loudspeaker, and wherein the circuitry is further adapted to generate the speakerphone output signal according to the following equation—second speakerphone output signal=((MIC output signal-(β×far end audio signal))-MVS output signal)/α.

According to the second aspect of the embodiments the system further comprises: a first network interface adapted to bidirectionally communicate with the circuitry of the speakerphone and one or more external devices; and an external calibration apparatus adapted to calibrate the system and generate the plurality of calibration factors.

According to the second aspect of the embodiments the external calibration apparatus comprises: a calibration loudspeaker; a second network interface adapted to bidirectionally communicate with the first network interface; a processor circuit that includes a memory device; a communications circuit adapted to facilitate transfers of data and commands between the processor circuit, the memory device, and the second network interface; and a first signal generator adapted to generate one or more acoustic audio test signals that can be broadcast by the calibration loudspeaker and received by the mic and the MVS, and further wherein the processor circuit is adapted to determine the transformation coefficients α and γ based on data generated by the generated one or more acoustic audio test signals.

According to the second aspect of the embodiments the external calibration apparatus further comprises: a second signal generator adapted to generate one or more electrical audio test signals that can be broadcast by the at least one loudspeaker in the speakerphone that generate test mechanical vibrations that are received by the mic and MVS, and further wherein the processor circuit is adapted to determine the transformation coefficients β and δ based on data generated by the generated test mechanical vibration signals.

According to the second aspect of the embodiments the one or more external devices comprise one or more devices interconnected with the system by one or more of a local area network, a wide area network, an Internet, a cellular communications network, a satellite communications network, a landline network, and a dedicated speakerphone network.

According to the second aspect of the embodiments the one or more devices includes one or more of a speakerphone system and a server computer.

According to the second aspect of the embodiments an output of the mic in regard to an input of an acoustic sound signal can be characterized by the application of the transfer coefficient α to the input acoustic sound signal, an output of the MVS in regard to an input of a mechanical vibration signal generated by the loudspeaker can be characterized by the application of the transfer coefficient β to the input mechanical vibration signal, an output of the MVS in regard to an input of the acoustic sound signal can be characterized by the application of the transfer coefficient γ to the input acoustic sound signal, and an output of the mic in regard to an input of the mechanical vibration signal generated by the loudspeaker can be characterized by the application of the transfer coefficient δ to the mechanical vibrations signal.

According to a third aspect of the embodiments, a speakerphone network (network) is provided, comprising: at least two speakerphones adapted to bidirectionally communicate with each other through an electronics communication network, wherein the network comprises one or more of a local area network, a wide area network, a dedicated speakerphone network, a cellular communications network, a satellite communications network, a landline telephone network, and an Internet network (Internet), and wherein the speakerphone comprises at least one mechanical vibration sensor (MVS) adapted to convert mechanical vibrations in a speakerphone enclosure (enclosure) to a mechanical vibration error signal, and output the same as an MVS output signal; at least one microphone (mic) adapted to convert an input sound acoustic signal into an input sound electrical signal and to output the same as a mic output signal; and circuitry adapted to subtract the MVS output signal from the mic output signal and output the resultant signal as a speakerphone output signal.

According to a fourth aspect of the embodiments, a speakerphone network (network) is provided comprising: at least two speakerphones adapted to bidirectionally communicate with each other through an electronics communication network, wherein the network comprises one or more of a local area network, a wide area network, a dedicated speakerphone network, a cellular communications network, a satellite communications network, a landline telephone network, and an Internet network (Internet), and wherein the speakerphone comprises at least one loudspeaker adapted to generate mechanical vibrations on an enclosure of the system; at least one microphone (mic) adapted to convert an input sound acoustic signal into an input sound electrical signal and adapted to convert the mechanical vibrations into a mechanical vibrations electrical signal, and to output both of the input sound electrical signal and the mechanical vibrations electrical signal as a mic output signal; at least one mechanical vibration sensor (MVS) adapted to convert the mechanical vibrations to a mechanical vibration error signal to output the mechanical vibration error signal as an MVS output signal; and circuitry adapted to subtract the MVS output signal from the mic output signal and output the resultant signal as a speakerphone output signal.

According to a fifth aspect of the embodiments a method for substantially eliminating the effect of mechanical vibration on an audio input to a speakerphone system is provided comprising: receiving an input sound acoustic signal at a microphone (mic); converting the received input sound acoustic signal into an input sound electrical signal, and outputting the same as a mic output signal; receiving mechanical vibrations at a mechanical vibration sensor (MVS); converting the received mechanical vibrations into a mechanical vibration error signal, and outputting the same as an MVS output signal; and generating a speakerphone system output signal by subtracting the MVS output signal from the mic output signal.

According to the fifth aspect of the embodiments the step of generating a speakerphone output signal comprises: receiving the output of the MVS at a first receiver; receiving the output of the mic at a second receiver; and subtracting the MVS output signal from the mic output signal using additional circuitry.

According to the fifth aspect of the embodiments the step of subtracting comprises: digitizing the received outputs of the first receiver and second receiver; and subtracting the digitized MVS output signal from the digitized mic output signal using a digital signal processor.

According to the fifth aspect of the embodiments the step of subtracting comprises: subtracting the MVS output signal from the mic output signal using analog circuitry.

According to the fifth aspect of the embodiments the MVS is one of a mic, an accelerometer, and a microelectromechanical system (MEMs) integrated accelerometer.

According to the fifth aspect of the embodiments the method further comprises: broadcasting an output sound from at least one loudspeaker into a volume of space exterior to that of the enclosure; and generating the mechanical vibrations on the enclosure resulting from the broadcast output sound.

According to the fifth aspect of the embodiments the method further comprises: broadcasting a backscatter sound into a volume of space within the enclosure; and generating the mechanical vibrations resulting from a combination of the output sound broadcast externally to the enclosure and the backscatter sound broadcast into the volume of the enclosure.

According to the fifth aspect of the embodiments the method further comprises: storing in memory a plurality of calibration factors, wherein the plurality of calibration factors comprises—$\alpha$, an input-to-output transformation coefficient for acoustic sound signals in regard to the mic (mic acoustic transformation coefficient/calibration factor), $\beta$, an input-to-output transformation coefficient for mechanical vibration signals generated by a loudspeaker that is part of the speakerphone in regard to the mic (mic vibration transformation coefficient/calibration factor), $\gamma$, an input-to-output transformation coefficient for acoustic sound signals in regard to the MVS (MVS acoustic transformation coefficient/calibration factor), and $\delta$, an input-to-output transformation coefficient for mechanical vibration signals generated by the loudspeaker in regard to the MVS (MVS vibration transformation coefficient/calibration factor).

According to the fifth aspect of the embodiments the method further comprises: performing bidirectional communications between a first network interface that is part of the speakerphone and one or more external devices.

According to the fifth aspect of the embodiments the step of performing bidirectional communications comprises: communicating with an external calibration system adapted to generate the plurality of calibration factors.

According to the fifth aspect of the embodiments the external calibration apparatus comprises—a calibration loudspeaker; a second network interface adapted to bidirectionally communicate with the first network interface; a processor circuit that includes a memory device; a communications circuit adapted to facilitate transfers of data and commands between the processor circuit, the memory device, and the second network interface; and a first signal generator adapted to generate one or more acoustic audio test signals.

According to the fifth aspect of the embodiments the method further comprises: generating the one or more acoustic audio test signals by the first signal generator that is broadcast by the calibration loudspeaker and received by the mic and the MVS, and determining the transformation coefficients $\alpha$ and $\gamma$ by the processor based on data generated by the generated one or more acoustic audio test signals.

According to the fifth aspect of the embodiments the calibration apparatus further comprises—a second signal generator adapted to generate one or more electrical audio test signal.

According to the fifth aspect of the embodiments the method further comprises: generating the one or more electrical audio test signals by the second signal generator that is broadcast by the at least one loudspeaker in the speakerphone that generates test mechanical vibrations that are received by the mic and MVS; and determining the transformation coefficients $\beta$ and $\delta$ by the processor based on data generated by the generated test mechanical vibration signals.

According to the fifth aspect of the embodiments the one or more external devices comprise one or more devices interconnected with the system by one or more of a local area network, a wide area network, an Internet, a cellular communications network, a satellite communications network, a landline network, and a dedicated speakerphone network.

According to the fifth aspect of the embodiments the one or more devices includes one or more of a speakerphone system and a server computer.

According to the fifth aspect of the embodiments an output of the mic in regard to an input of an acoustic sound signal can be characterized by the application of the transfer coefficient $\alpha$ to the input acoustic sound signal, an output of the MVS in regard to an input of a mechanical vibration signal generated by the loudspeaker can be characterized by the application of the transfer coefficient $\beta$ to the input mechanical vibration signal, an output of the MVS in regard to an input of the acoustic sound signal can be characterized by the application of the transfer coefficient $\gamma$ to the input acoustic sound signal, and an output of the mic in regard to an input of the mechanical vibration signal generated by the loudspeaker can be characterized by the application of the transfer coefficient $\delta$ to the mechanical vibrations signal.

According to a sixth aspect of the embodiments, a method for substantially eliminating the effect of mechanical vibration on an audio input to a speakerphone system is provided comprising: receiving mechanical vibrations and an input sound acoustic signal at a microphone (mic); converting the received mechanical vibrations and input sound acoustic signal into an input sound electrical signal, and outputting the same as a mic output signal; receiving mechanical vibrations at a mechanical vibration sensor (MVS); converting the received mechanical vibrations into a mechanical vibration error signal, and outputting the same as an MVS output signal; and generating a speakerphone system output signal by subtracting the MVS output signal from the mic output signal.

According to the sixth aspect of the embodiments the step of generating a speakerphone output signal comprises: receiving the output of the MVS at a first receiver; receiving the output of the mic at a second receiver; and subtracting the MVS output signal from the mic output signal using additional circuitry.

According to the sixth aspect of the embodiments the step of subtracting comprises: digitizing the received outputs of the first receiver and second receiver; and subtracting the digitized MVS output signal from the digitized mic output signal using a digital signal processor.

According to the sixth aspect of the embodiments the step of subtracting comprises: subtracting the MVS output signal from the mic output signal using analog circuitry.

According to the sixth aspect of the embodiments the MVS is one of a mic, an accelerometer, and a microelectromechanical system (MEMs) integrated accelerometer.

According to the sixth aspect of the embodiments the method further comprises: broadcasting an output sound from at least one loudspeaker into a volume of space exterior to that of the enclosure; and generating the mechanical vibrations on the enclosure resulting from the broadcast output sound.

According to the sixth aspect of the embodiments the method further comprises: broadcasting a backscatter sound into a volume of space within the enclosure; and generating the mechanical vibrations resulting from a combination of the output sound broadcast externally to the enclosure and the backscatter sound broadcast into the volume of the enclosure.

According to the sixth aspect of the embodiments the method further comprises: storing in memory a plurality of calibration factors, wherein the plurality of calibration factors comprises—$\alpha$, an input-to-output transformation coefficient for acoustic sound signals in regard to the mic (mic acoustic transformation coefficient/calibration factor), $\beta$, an input-to-output transformation coefficient for mechanical vibration signals generated by a loudspeaker that is part of the speakerphone in regard to the mic (mic vibration transformation coefficient/calibration factor), $\gamma$, an input-to-output transformation coefficient for acoustic sound signals in regard to the MVS (MVS acoustic transformation coefficient/calibration factor), and $\delta$, an input-to-output transformation coefficient for mechanical vibration signals generated by the loudspeaker in regard to the MVS (MVS vibration transformation coefficient/calibration factor).

According to the sixth aspect of the embodiments the method further comprises: receiving a far end audio signal prior to being broadcast by the loudspeaker; and generating the speakerphone output signal according to the following equation—second speakerphone output signal=((MIC output signal-($\beta$×far end audio signal))–MVS output signal)/$\alpha$.

According to the sixth aspect of the embodiments the method further comprises: converting the input sound acoustic signal into an input sound error signal (126"); and outputting both the mechanical vibration error signal and the input sound error signal as an MVS output signal.

According to the sixth aspect of the embodiments the method further comprises: receiving a far end audio signal prior to being broadcast by the loudspeaker; and generating the speakerphone output signal according to the following equation—second speakerphone output signal=((MIC output signal-($\beta$×far end audio signal))–MVS output signal)/$\alpha$.

According to the sixth aspect of the embodiments the method further comprises: performing bidirectional communications between a first network interface that is part of the speakerphone and one or more external devices.

According to the sixth aspect of the embodiments the step of performing bidirectional communications comprises: communicating with an external calibration system adapted to generate the plurality of calibration factors.

According to the sixth aspect of the embodiments the external calibration apparatus comprises—a calibration loudspeaker; a second network interface adapted to bidirectionally communicate with the first network interface; a processor circuit that includes a memory device; a communications circuit adapted to facilitate transfers of data and commands between the processor circuit, the memory device, and the second network interface; and a first signal generator adapted to generate one or more acoustic audio test signals.

According to the sixth aspect of the embodiments the method further comprises: generating the one or more acoustic audio test signals by the first signal generator that is broadcast by the calibration loudspeaker and received by the mic and the MVS, and determining the transformation coefficients $\alpha$ and $\gamma$ by the processor based on data generated by the generated one or more acoustic audio test signals.

According to the sixth aspect of the embodiments the calibration apparatus further comprises—a second signal generator adapted to generate one or more electrical audio test signals.

According to the sixth aspect of the embodiments the method further comprises: generating the one or more electrical audio test signals by the second signal generator that is broadcast by the at least one loudspeaker in the speakerphone that generates test mechanical vibrations that are received by the mic and MVS; and determining the transformation coefficients $\beta$ and $\delta$ by the processor based on data generated by the generated test mechanical vibration signals.

According to the sixth aspect of the embodiments the one or more external devices comprise one or more devices interconnected with the system by one or more of a local area network, a wide area network, an Internet, a cellular communications network, a satellite communications network, a landline network, and a dedicated speakerphone network.

According to the sixth aspect of the embodiments the one or more devices includes one or more of a speakerphone system and a server computer.

According to the sixth aspect of the embodiments an output of the mic in regard to an input of an acoustic sound signal can be characterized by the application of the transfer coefficient $\alpha$ to the input acoustic sound signal, an output of the MVS in regard to an input of a mechanical vibration signal generated by the loudspeaker can be characterized by the application of the transfer coefficient $\beta$ to the input mechanical vibration signal, an output of the MVS in regard to an input of the acoustic sound signal can be characterized by the application of the transfer coefficient $\gamma$ to the input acoustic sound signal, and an output of the mic in regard to an input of the mechanical vibration signal generated by the loudspeaker can be characterized by the application of the transfer coefficient $\delta$ to the mechanical vibrations signal.

According to a seventh aspect of the embodiments, a speakerphone calibration system (system) is provided, comprising: a calibration unit adapted to generate at least one test signal, and further adapted to determine at least one calibration factor in response to at least one test signal, and wherein a first calibration factor characterizes a speakerphone system under test in regard to mechanical vibrations generated in the speakerphone system under test, the mechanical vibrations caused by a first test signal.

According to the seventh aspect of the embodiments, the calibration unit further comprises: a first processor adapted to generate the first test signal; and a first communications interface adapted to transmit the first test signal to the speakerphone system under test, and wherein the speakerphone system under test comprises—a microphone (mic) adapted to receive acoustic energy and convert the same to a mic electrical signal; a second communications interface adapted to receive the first test signal; a second processor; a loudspeaker adapted to receive an electrical audio signal and broadcast the same as an acoustic signal; a mechanical vibration sensor adapted to sense vibrations in an enclosure of the speakerphone system and convert the same to an MVS electrical signal.

According to the seventh aspect of the embodiments the second processor of the speakerphone system under test is adapted to process the first test signal and generate a first audio test signal based on the first test signal, and transmit the same to the loudspeaker, the loudspeaker is adapted to receive the first audio test signal, broadcast the same as a first acoustic signal, and to generate a first set of vibrations on an enclosure of the speakerphone system under test based on the first test signal, and the MVS is adapted to sense the first set of vibrations on the enclosure of the speakerphone system based on the first test signal, and to convert the same to a first MVS electrical signal.

According to the seventh aspect of the embodiments the calibration unit is further adapted to generate an input-to-output transformation coefficient for mechanical vibration signals generated by the loudspeaker in regard to the mechanical vibration sensor (calibration factor $\delta$), the calibration factor $\delta$ based on a comparison between the first test signal and the first MVS electrical signal.

According to the seventh aspect of the embodiments the mic is adapted to sense the first set of vibrations on the enclosure of the speakerphone system based on the first test signal, and to convert the same to an mic electrical signal.

According to the seventh aspect of the embodiments the calibration unit is further adapted to generate an input-to-output transformation coefficient for mechanical vibration signals generated by the loudspeaker in regard to the mic (calibration factor $\beta$), the calibration factor $\beta$ based on a comparison between the first test signal and the first mic electrical signal.

According to the seventh aspect of the embodiments the calibration unit further comprises: a calibration loudspeaker, and wherein the calibration unit is adapted to generate a second test signal that is transmitted to the calibration loudspeaker, wherein the calibration loudspeaker is adapted to receive the second test signal and broadcast a second acoustic test signal, and wherein the second acoustic test signal generates a second set of vibrations, and the MVS is adapted to sense the second set of vibrations on the enclosure of the speakerphone system based on the second test signal, and to convert the same to a second MVS electrical signal.

According to the seventh aspect of the embodiments the calibration unit is further adapted to generate an input-to-output transformation coefficient for acoustic sound signals generated by the calibration loudspeaker in regard to the mechanical vibration sensor (calibration factor $\gamma$), the calibration factor $\gamma$ based on a comparison between the second test signal and the second MVS electrical signal.

According to the seventh aspect of the embodiments the mic is adapted to sense the second set of vibrations on the enclosure of the speakerphone system based on the second test signal, and to convert the same to a second mic electrical signal.

According to the seventh aspect of the embodiments the calibration unit is further adapted to generate an input-to-output transformation coefficient for acoustic sound signals generated by the calibration loudspeaker in regard to the mic (calibration factor $\alpha$), the calibration factor $\alpha$ based on a comparison between the second test signal and the second mic electrical signal.

According to an eighth aspect of the embodiments, a speakerphone system is provided comprising: a processor adapted to generate at least one test signal, and further adapted to determine at least one calibration factor in response to at least one test signal, and wherein a first calibration factor characterizes the speakerphone system during calibration in regard to mechanical vibrations generated in the speakerphone system under test, the mechanical vibrations caused by a first test signal; a first communications interface adapted to transmit the first test signal to the speakerphone system under test, and wherein the speakerphone system under test comprises—a microphone (mic) adapted to receive acoustic energy and convert the same to a mic electrical signal; a second communications interface adapted to receive the first test signal; a second processor; a loudspeaker adapted to receive an electrical audio signal and broadcast the same as an acoustic signal; a mechanical vibration sensor adapted to sense vibrations in an enclosure of the speakerphone system and convert the same to an MVS electrical signal.

According to the eighth aspect of the embodiments, the second processor of the speakerphone system under test is adapted to process the first test signal and generate a first audio test signal based on the first test signal, and transmit the same to the loudspeaker, the loudspeaker is adapted to receive the first audio test signal, broadcast the same as a first acoustic signal, and to generate a first set of vibrations on an enclosure of the speakerphone system under test based on the first test signal, and the MVS is adapted to sense the first set of vibrations on the enclosure of the speakerphone system based on the first test signal, and to convert the same to a first MVS electrical signal.

According to the eighth aspect of the embodiments the calibration unit is further adapted to generate an input-to-output transformation coefficient for mechanical vibration signals generated by the loudspeaker in regard to the mechanical vibration sensor (calibration factor $\delta$), the calibration factor $\delta$ based on a comparison between the first test signal and the first MVS electrical signal.

According to the eighth aspect of the embodiments the mic is adapted to sense the first set of vibrations on the enclosure of the speakerphone system based on the first test signal, and to convert the same to an mic electrical signal.

According to the eighth aspect of the embodiments the calibration unit is further adapted to generate an input-to-output transformation coefficient for mechanical vibration signals generated by the loudspeaker in regard to the mic (calibration factor $\beta$), the calibration factor $\beta$ based on a comparison between the first test signal and the first mic electrical signal.

According to the eighth aspect of the embodiments the calibration unit further comprises: a calibration loudspeaker, and wherein the calibration unit is adapted to generate a second test signal that is transmitted to the calibration loudspeaker, wherein the calibration loudspeaker is adapted to receive the second test signal and broadcast a second acoustic test signal, and wherein the second acoustic test signal generates a second set of vibrations, and the MVS is adapted to sense the second set of vibrations on the enclosure of the speakerphone system based on the second test signal, and to convert the same to a second MVS electrical signal.

According to the eighth aspect of the embodiments the calibration unit is further adapted to generate an input-to-output transformation coefficient for acoustic sound signals generated by the calibration loudspeaker in regard to the mechanical vibration sensor (calibration factor γ), the calibration factor γ based on a comparison between the second test signal and the second MVS electrical signal.

According to the eighth aspect of the embodiments the mic is adapted to sense the second set of vibrations on the enclosure of the speakerphone system based on the second test signal, and to convert the same to a second mic electrical signal.

According to the eighth aspect of the embodiments the calibration unit is further adapted to generate an input-to-output transformation coefficient for acoustic sound signals generated by the calibration loudspeaker in regard to the mic (calibration factor α), the calibration factor α based on a comparison between the second test signal and the second mic electrical signal.

According to a ninth aspect of the embodiments, a method for calibrating a speakerphone system under test is provided comprising; connecting a calibration unit to the speakerphone system under test (SSUT) via a communications interface, and wherein the SSUT further comprises a loudspeaker, microphone (mic), and mechanical vibration sensor (MVS); generating a first test signal by the calibration unit and transmitting the same to the SSUT; generating a first set of mechanical vibrations in response to the first test signal in the SSUT; and determining a calibration factor in regard to the first test signal and first set of mechanical vibrations by the calibration unit.

According to the ninth aspect of the embodiments, the step of determining a calibration factor in regard to the first test signal and first set of mechanical vibrations by the calibration unit comprises: receiving the first test signal at the SSUT, and processing the same; generating a first audio signal based on the first test signal, and then outputting the same to the loudspeaker; broadcasting a first acoustic signal by the loudspeaker, wherein the broadcast first acoustic signal generates the first set of mechanical vibrations on an enclosure of the SSUT; receiving the first set of mechanical vibrations at the MVS; converting the first set of mechanical vibrations by the MVS into a first MVS electrical signal; and generating an input-to-output transformation coefficient for mechanical vibration signals generated by the loudspeaker in regard to the MVS (calibration factor δ), wherein the calibration factor δ is based on a comparison between the first test signal and the first MVS electrical signal.

According to the ninth aspect of the embodiments the step of generating the calibration factor δ comprises: receiving the first MVS electrical signal at the calibration unit; comparing the first MVS electrical signal with the first test signal; and generating the calibration factor δ based on the results of the comparison.

According to the ninth aspect of the embodiments the step of comparing comprises: comparing the first MVS electrical signal and the first test signal on the basis of frequency versus amplitude; and determining the calibration factor δ as a function of amplitude versus frequency, According to the ninth aspect of the embodiments the step of determining the calibration factor δ comprises: determining a difference between the first MVS electrical signal and the first test signal wherein the calibration factor δ comprises a set of discrete amplitude factors at predetermined frequency points, such that the amplitude factors can be multiplied against a new output of the MVS at the predetermined frequency points.

According to the ninth aspect of the embodiments the step of determining a calibration factor in regard to the first test signal and first set of mechanical vibrations by the calibration unit comprises: receiving the first test signal at the SSUT, and processing the same; generating a first audio signal based on the first test signal, and then outputting the same to the loudspeaker; broadcasting a first acoustic signal by the loudspeaker, wherein the broadcast first acoustic signal generates the first set of mechanical vibrations on an enclosure of the SSUT; receiving the first set of mechanical vibrations at the mic; converting the first set of mechanical vibrations by the mic into a first mic electrical signal; and generating an input-to-output transformation coefficient for mechanical vibration signals generated by the loudspeaker in regard to the mic (calibration factor β), wherein the calibration factor β is based on a comparison between the first test signal and the first mic electrical signal.

According to the ninth aspect of the embodiments the step of generating the calibration factor β comprises: receiving the first mic electrical signal at the calibration unit; comparing the first mic electrical signal with the first test signal; and generating the calibration factor β based on the results of the comparison.

According to the ninth aspect of the embodiments the step of comparing comprises: comparing the first mic electrical signal and the first test signal on the basis of frequency versus amplitude; and determining the calibration factor β as a function of amplitude versus frequency.

According to the ninth aspect of the embodiments the step of determining the calibration factor comprises: determining a difference between the first mic electrical signal and the first test signal wherein the calibration factor β comprises a set of discrete amplitude factors at predetermined frequency points, such that the amplitude factors can be multiplied against a new output of the mic at the predetermined frequency points.

According to a tenth aspect of the embodiments, a method for calibrating a speakerphone system under test is provided, comprising; connecting a calibration unit to the speakerphone system under test (SSUT) via a communications interface, wherein the SSUT further comprises a microphone (mic), and mechanical vibration sensor (MVS), and wherein the calibration unit further comprises a calibration loudspeaker; generating a first test signal by the calibration unit and transmitting the same to the calibration loudspeaker; broadcasting a first acoustic audio test signal by the calibration loudspeaker; generating a first set of mechanical vibrations in response to the first acoustic audio test signal in the SSUT; and determining a calibration factor in regard to the first test signal and first set of mechanical vibrations by the calibration unit.

According to the tenth aspect of the embodiments the step of determining a calibration factor in regard to the first test signal and first set of mechanical vibrations by the calibration unit comprises: receiving the first acoustic audio test signal at the SSUT, and generating the first set of mechanical vibrations on an enclosure of the SSUT in response to the received first acoustic audio test signal; receiving the first set of mechanical vibrations at the MVS; converting the first set of mechanical vibrations by the MVS into a first MVS electrical signal; and generating an input-to-output transformation coefficient for mechanical vibration signals generated by the calibration loudspeaker in regard to the MVS (calibration factor γ), wherein the calibration factor γ is based on a comparison between the first test signal and the first MVS electrical signal.

According to the tenth aspect of the embodiments the step of generating the calibration factor γ comprises: receiving the first MVS electrical signal at the calibration unit; comparing the first MVS electrical signal with the first test signal; and generating the calibration factor γ based on the results of the comparison.

According to the tenth aspect of the embodiments the step of comparing comprises: comparing the first MVS electrical signal and the first test signal on the basis of frequency versus amplitude; and determining the calibration factor δ as a function of amplitude versus frequency.

According to the tenth aspect of the embodiments the step of determining the calibration factor δ comprises: determining a difference between the first MVS electrical signal and the first test signal wherein the calibration factor δ comprises a set of discrete amplitude factors at predetermined frequency points, such that the amplitude factors can be multiplied against a new output of the MVS at the predetermined frequency points.

According to the tenth aspect of the embodiments the step of determining a calibration factor in regard to the first test signal and first set of mechanical vibrations by the calibration unit comprises: receiving the first acoustic audio test signal at the SSUT, and generating the first set of mechanical vibrations on an enclosure of the SSUT in response to the received first acoustic audio test signal; receiving the first set of mechanical vibrations at the mic; converting the first set of mechanical vibrations by the mic into a first mic electrical signal; and generating an input-to-output transformation coefficient for mechanical vibration signals generated by the calibration loudspeaker in regard to the mic (calibration factor α), wherein the calibration factor α is based on a comparison between the first test signal and the first mic electrical signal.

According to the tenth aspect of the embodiments the step of generating the calibration factor α comprises: receiving the first mic electrical signal at the calibration unit; comparing the first mic electrical signal with the first test signal; and generating the calibration factor α based on the results of the comparison.

According to the tenth aspect of the embodiments the step of comparing comprises: comparing the first mic electrical signal and the first test signal on the basis of frequency versus amplitude; and determining the calibration factor α as a function of amplitude versus frequency.

According to the tenth aspect of the embodiments the step of determining the calibration factor comprises: determining a difference between the first mic electrical signal and the first test signal wherein the calibration factor α comprises a set of discrete amplitude factors at predetermined frequency points, such that the amplitude factors can be multiplied against a new output of the mic at the predetermined frequency points.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

DETAILED DESCRIPTION

Figure 1:
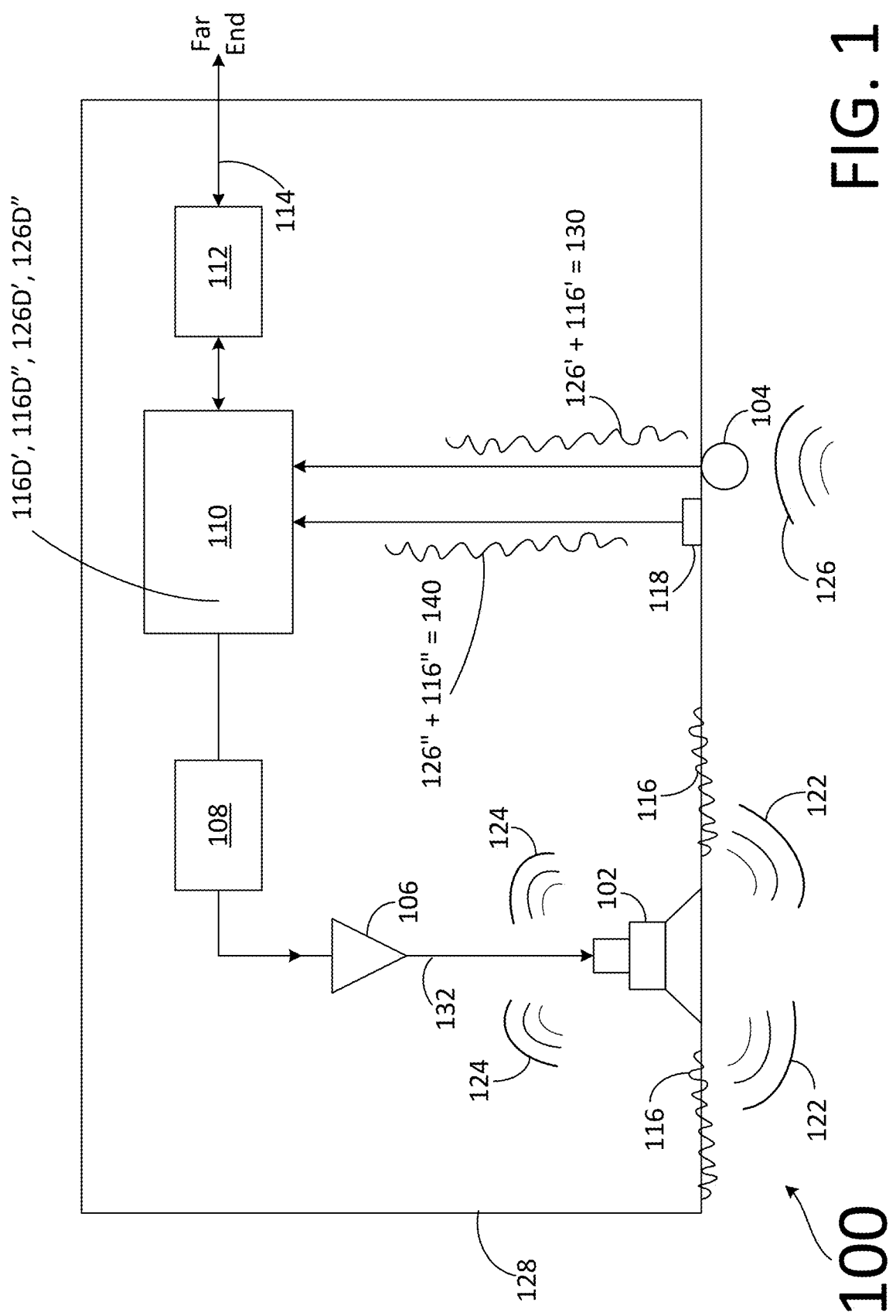
FIG. 1 illustrates a speakerphone system according to aspects of the embodiments.

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices, such as speakerphone systems.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" or "in an embodiment" in various places throughout the specification is not necessarily referring to the same embodiment. Further, the particular feature, structures, or characteristics may be combined in any suitable manner in one or more embodiments.

LIST OF REFERENCE NUMBERS FOR THE ELEMENTS IN THE DRAWINGS IN NUMERICAL ORDER

The following is a list of the major elements in the drawings in numerical order.

100 Speakerphone System
102 Loudspeaker
104 Microphone (Mic)
106 Amplifier (Amp)
108 Low Pass Filter (LPF)
110 Audio Processor (Can contain one or more Digital Signal Processors (DSPs))
112 Network (NW) Interface (IF)
114 Network Cable/Power-over-Ethernet (PoE)
116 Mechanical Vibrations (Vibrations)
116' Mechanical Vibration Electrical Signal
116D' Digitized Vibration Electrical Signal
116" Mechanical Vibration Error Signal
116D" Digitized Vibration Error Signal
118 Mechanical Vibrations Sensor (MVS)
122 Output Sound Acoustic Signal
124 Backscatter Acoustic Sound Signal
126 Input Sound Acoustic Signal
126' Input Sound Electrical Signal
126D' Digitized Input Sound Electrical Signal
126" Input Sound Error Signal
126D" Digitized Input Sound Error Signal
128 Enclosure
130 Mic Output Signal
132 Far End Audio Signal 132
140 MVS Output Signal
202 Receiver, Amplifier, Filter
204 Analog to Digital Converter (ADC)
206 Processor/Digital Signal Processor (DSP)
208 Speakerphone Output Signal
300 Method for Calibrating a Speakerphone
302-308 Method Steps of Method 300
400 Method for Using a Speakerphone
402-414 Method Steps of Method 400
500 Speakerphone Calibration System
502 Calibration Unit
504 Calibration Processor/Memory
506 Calibration Loudspeaker(s)
600 Network System
606 Internet Service Provider (ISP)
608 Modulator/Demodulator (Modem)
610 Wireless Router
612. Plain Old Telephone Service (POTS) Provider
614 Cellular Service Provider
618 Communication Satellites
620 Cellular Telecommunications Service Tower (Cell Tower)
622 Internet
626 Satellite Communication Systems Control Station
702 Test Signal
704 Output Signal from Device Under Test List of Acronyms Used in the Specification in Alphabetical Order The following is a list of the acronyms used in the specification in alphabetical order.

α Input-to-Output Transformation Coefficient for Acoustic Sound Signals in regard to the Microphone (Mic acoustic transformation coefficient/calibration factor)
β Input-to-Output Transformation Coefficient for Mechanical Vibration Signals Generated by the Loudspeaker in regard to the Microphone (Mic vibration transformation coefficient/calibration factor)
γ Input-to-Output Transformation Coefficient for Acoustic Sound Signals in regard to the Mechanical Vibration Sensor (MVS acoustic transformation coefficient/calibration factor)
δ Input-to-Output Transformation Coefficient for Mechanical Vibration Signals Generated by the Loudspeaker in regard to Mechanical Vibration Sensor (MVS vibration transformation coefficient/calibration factor)
ADC Analog to Digital Converter
Amp Amplifier (Amp)
BT Bluetooth
DSP Digital Signal Processor (DSP)
GPS Global Positioning System
HZ Hertz
IF Interface
ISP Internet Service Provider
kHz Kilo-Hertz
LPF Low Pass Filter (LPF)
Mic Microphone (Mic)
MVS Mechanical Vibrations Sensor (MVS)
MVs Mechanical Vibrations (MVs)
NFC Near Field Communications
NW Network
PoE Power-over-Ethernet (PoE)
POTs Plain Old Telephone Service The different aspects of the embodiments described herein pertain to the context of systems, methods, and modes for substantially or completely eliminating mechanical vibration energy from the loudspeaker that is converted to acoustical signals that can be acquired by a microphone as an error signal in the speakerphone, but is not limited thereto, except as may be set forth expressly in the appended claims.

For 40 years Creston Electronics Inc., has been the world's leading manufacturer of advanced control and automation systems, innovating technology to simplify and enhance modern lifestyles and businesses. Crestron designs, manufactures, and offers for sale integrated solutions to control audio, video, conferencing, computer, and environmental systems. In addition, the devices and systems offered by Crestron streamlines technology, improving the quality of life for people who work and live in commercial buildings, universities, hotels, hospitals, and homes, among other locations.

Accordingly, the systems, methods, and modes of the aspects of the embodiments described herein, as further embodied in the attached drawings, can be manufactured, marketed, and sold by Crestron Electronics Inc., located in Rockleigh, N.J.

Accordingly, the systems, methods, and modes of the aspects of the embodiments described herein, as embodied as a speakerphone that incorporates a mechanical vibration sensor that can substantially or completely eliminate mechanical vibration energy from being considered as acoustical voice sounds can be manufactured by Crestron Electronics Inc., located in Rockleigh, N.J.

FIG. 1 illustrates speakerphone system (speakerphone) 100 according to aspects of the embodiments. Speakerphone 100 comprises an enclosure 128, and one or more of a loudspeaker 102, microphone (mic) 104, amplifier (amp) 106, filter (typically, though not necessarily, a low pass filter (LPF)) 108, audio signal processor (processor) 110 (which can, though may not necessarily, be embodied as a digital signal processor (DSP)), network interface (NW IF) 112, network cable 114 (which can transmit not only data, such as audio data to and from processor 110, but which can also transmit power, such as, for example, in the form of power-over-Ethernet (PoE)), and mechanical vibration sensor (MVS) 118, arranged in the manner shown, though the same is not to be taken in a limiting manner, as other arrangements and interchangeable devices can also be implemented according to aspects of the embodiments (for example, one or more of amp 106, filter 108 can be included in a single device, along with processor 110, according to further aspects of the embodiments). Other means for powering speakerphone 100 can also be used, including one or more of a battery (which can, but does not necessarily need to be rechargeable), and a conventional power supply powered by 120/240 VAC. According to further aspects of the embodiments, the circuitry of elements 106, 108, and 110 can be embodied as purely digital circuitry, purely analog circuitry, or any combination thereof. Cable 114 can connect through one of many different types of networks, including but not limited to, intranets, the Internet, local area networks, wide area networks, cellular and/or satellite based networks, landline based networks, and any combinations thereof, to a second, or plurality of remotely located "far end" speakerphones 100, according to aspects of the embodiments.

As briefly discussed above, loudspeaker 102, when broadcasting sound waves, by the very nature of its operation, causes mechanical vibrations (vibrations) 116 to occur on enclosure 128. MVS 118 has been included, according to aspects of the embodiments, to detect vibrations 116, and generate mechanical vibration error signal 116". Vibrations 116 are acquired by mic 104 and converted to an electrical signal, mechanical vibration electrical signal 116'. As those of skill in the art can appreciate, mics 104 operate by receiving vibrations in the air on a transducer surface, and converting the received or acquired acoustical energy into an electrical signal that represents a received acoustical audio signal. Unfortunately, vibrations that occur in or on enclosure 128 can also be acquired by mic 104 in a substantially similar manner; these unwanted vibrations, however, do not represent desired input sound acoustic signal 126 but an acoustical signal resulting from mechanical vibrations 116 that can detrimentally affect the quality of the received audio signal. Once received at mic 104, and converted to electrical signals, input sound acoustic signal 126 becomes input sound electrical signal 126'. Thus, according to aspects of the embodiments, the output of mic 104 can also be referred to as mic output signal 130, and it is defined, in part, as the combination of the desired input sound electrical signal plus an un-desired mechanical vibration electrical signal (i.e., microphone output signal 130 is a combination of mechanical vibration electrical signal 116' and input sound electrical signal 126'; or 130=126'+116').

To eliminate the effect of the undesired mechanical vibrations that have been converted to audio signals in mic 104, MVS 118 has been included according to aspects of the embodiments. MVS 118 detects vibrations 116 and converts the mechanical signal to an electrical signal, mechanical vibration error signal 116". According to further aspects of the embodiments, it would be preferable if the electrical output of MVS 118, mechanical vibration error signal 116" exactly represented the output of mic 104 due to vibrations 116. In that case, then by merely subtracting mechanical vibration error signal 116" from Mic output signal 130 would result in input sound electrical signal 126', which would be a very close replication of input sound acoustic signal 126. According to aspects of the embodiments, calibration factors, discussed in greater detail below, can be generated that can substantially equalize the two outputs; that is, a first factor can be applied to vibrations 116 to produce mechanical vibrations error signal 116" that is substantially equal to mechanical vibration electrical signal 116', which itself can be generated through the use of a second calibration factor. As those of skill in the art can appreciate, subtraction can occur in either analog circuitry, or digital, or a combination of both.

According to further aspects of the embodiments, however, there is an additional factor that can be taken into account: when one or more people create input sound acoustic signal 126, such signal generates an output from MVS 118; this becomes input sound error signal 126", as shown in FIG. 1. Thus, according to aspects of the embodiments, the output of MVS 118 can also be referred to as MVS output signal 140, and it is defined, in part, as the combination of input sound error signal 126" plus mechanical vibration error signal 116" (i.e., MVS output signal 140 is a combination of input sound error signal 126" plus mechanical vibration error signal 116"; or 140=126"+116").

As briefly discussed above, loudspeaker 102, when broadcasting sound waves, by the very nature of its operation, causes mechanical vibrations (vibrations) 116 to occur on enclosure 128. Vibrations 116 are acquired by mic 104 and converted to an electrical signal, mechanical vibration electrical signal 116'. As those of skill in the art can appreciate, mics 104 operate by receiving vibrations in the air on a transducer surface, and converting the received or acquired acoustical energy into an electrical signal that represents a received acoustical audio signal. Unfortunately, vibrations that occur in or on enclosure 128 can also be acquired by mic 104 in a substantially similar manner; these unwanted vibrations, however, do not represent desired input sound acoustic signal 126 but an acoustical signal resulting from mechanical vibrations 116 that can detrimentally affect the quality of the received audio signal. Once received at mic 104, and converted to electrical signals, input sound acoustic signal 126 becomes input sound electrical signal 126'. Thus, according to aspects of the embodiments, the output of mic 104 can also be referred to as mic output signal 130, and it is defined, in part, as the combination of the desired input sound electrical signal plus an un-desired mechanical vibration electrical signal (i.e., microphone output signal 130 is a combination of mechanical vibration electrical signal 116' and input sound electrical signal 126'; or 130=126'+116').

Although a detailed discussion of the operation of loudspeaker 102 is both not needed and beyond the scope of the discussion to understand the aspects of the embodiments, a brief review will assist the reader. As those of skill in the art can appreciate, speakers 102 generally consist of a permanent magnet and electromagnetic coil (coil) attached to the narrow portion of a cone shaped apparatus, which is generally very lightweight, though resilient. When a fluctuating electric current flows through the coil, it becomes a temporary electromagnet, attracted and repelled by the permanent magnet. As the coil moves, it moves the cone to which it is attached back and forth, creating output sound acoustic signal 122 that is broadcast, or pumped into the air, and backscatter acoustic sound signal 124 that is input into an interior of enclosure 128. Thus, loudspeaker 102 is an electro-mechanical device that operates to create output sound acoustic signal 122 by vibrating in accordance with an alternating electrical signal and which can cause vibrations 116. Vibrations 116 are caused by transferal of the mechanical energy created by the moving/vibrating cone via mechanical coupling from the cone to the frame that holds the cone, and then from the frame to enclosure 128 that secures loudspeaker 102 in place. In addition, the impact of backscatter acoustic signal 124 on enclosure 128 can contribute to vibrations 116.

Vibrations 116 that occur on enclosure 128 are then transferred onto the transducer surface of mic 104 through further mechanical coupling between mic 104 and enclosure 128. Such mechanical vibrations 116 can occur over a wide range of frequencies, of varying energies, but such frequencies can include those within the audio range and be of such energy level as to be acquired by mic 104 and converted to an electrical signal, mechanical vibration electrical signal 116'. Mechanical vibration electrical signal 116' is audio noise and unfortunately such audio noise is virtually indistinguishable from an electrical signal created as a result of input sound acoustic signal 126, i.e., input sound electrical signal 126'. Because mechanical vibration electrical signal 116' is virtually indistinguishable from input sound electrical signal 126', the former cannot simply be filtered out in the presence of the latter; advanced signal processing techniques must be used, as described below.

As those of skill in the art can appreciate, when a signal is converted from one medium to another (e.g., an acoustic signal to an electrical signal), there is often a transformation in amplitude, phase, and frequency; in addition, such transformations also occur when a signal is throughput a device within a single medium, such as a filter in regard to an electrical signal. In those latter cases, the signal too is generally transformed in terms of amplitude, phase, and frequency. In some cases, such as in a electrical frequency filter, there relatively little change in frequency, but there can be an elimination of certain frequencies such as in a notch filter, or a low pass filter, and the like. In these types of frequency filters there will be some amplitude and phase changes, though these can be minimized in some cases.

In regard to aspects of the embodiments, a transformation occurs between inputs to MVS 118 and mic 104 and their respective outputs. These are shown as follows:

$$126'=126*\alpha \qquad \text{Eq.1:}$$

$$116'=116*\beta \qquad \text{Eq.2:}$$

$$126''=126*\gamma \qquad \text{Eq.3:}$$

$$116''=116*\delta \qquad \text{Eq.4:}$$

In Equation 1 the coefficient α represents the amplitude, phase, and frequency change that occurs when input sound acoustic signal 126 is transformed to input sound electrical signal 126'. In Equation 2 the coefficient β represents that conversion of mechanical vibration 116 into an electrical signal, mechanical vibration signal 116'; in Equation 3 the coefficient γ represents that conversion of input sound acoustic signal 126 into an electrical signal through MVS 118, input sound error signal 126"; and in Equation 4 the coefficient δ represents that conversion of mechanical vibration 116 into an electrical signal through MVS 118, mechanical vibration error signal 116". In all of Equations (1)-(4), the respective signal is multiplied by the coefficient.

According to aspects of the embodiments, in use, the signal output to loudspeaker 102, far end audio signal 132, is known to speakerphone 100 prior to being output or broadcast by loudspeaker 102. Therefore, when determining what β should be, speakerphone 100 can take into account the transformation by loudspeaker 102 of input audio signal 132 to vibrations 116, and the transformation by mic 104 of vibrations 116 to mechanical vibration electrical signal 116'. And, when determining what δ should be, speakerphone 100 can take into account the transformation by loudspeaker 102 of input audio signal 132 to vibrations 116, and the transformation by MVS 118 of vibrations 116 to mechanical vibration error signal 116". Therefore, Equations 2 and 4 become:

$$116'=132*\beta \qquad \text{Eq. 2':}$$

$$116''=132*\delta \qquad \text{Eq.4':}$$

As those of skill in the art can therefore appreciate, the presence of a noise signal, mechanical vibration electrical signal 116', decreases the performance of speakerphone system 100 by degrading the signal-to-noise ratio (SNR; increasing the amount of noise makes the SNR value decrease), among other performance attributes. As those of skill in the art can art can appreciate, a necessary feature of a speakerphone is acoustic echo cancellation. Acoustic echo occurs when acoustic energy from loudspeaker 102 couples into mic 104. For proper speakerphone operation, this loudspeaker acoustic energy must be removed. Acoustic echo can be removed electronically with a digital signal processor executing an acoustic echo cancellation (AEC) algorithm. In a greatly simplified explanation, the output from loudspeaker 102 (actually the signal input to loudspeaker 102) is subtracted from the output of mic 104; if distortions occurs, then a "true" subtraction is difficult and/or impossible to achieve, and some acoustic echo will occur, and the signal that is sent to the far end will exhibit an echo, because the output of mic 104 will include signals that include energy that originated at the far end, hence the term "echo."

As those of skill in the art can appreciate, by its very nature, mechanical vibration 116 can be characterized as a distortion signal, and cannot be removed by an AEC algorithm. The output of mic 104, then, in the presence of mechanical vibrations 116, becomes input sound electrical signal 126' (the output of mic 104 resulting from input sound acoustic signal 126 being input to mic 104) plus mechanical vibration electrical signal 116' (the result of mechanical coupling between loudspeaker 102, enclosure 128, and mic 104), as shown in FIG. 1. Of course, FIG. 1 is a but a simplified version of what speakerphone 100 can include, as there can two or more speakers 102, two or more mics 104, and two or more MVSs 118, as well as a plurality of other circuitry to support the aforementioned articles.

According to aspects of the embodiments, therefore, it would be advantageous to substantially or completely eliminate the effects of vibration on the received audio signal so as to maintain or increase the fidelity thereof. According to aspects of the embodiments, speakerphone 100 therefore includes MVS 118 that, when located in close proximity to mic 104, receives substantially similar mechanical vibrations 116 as does mic 104 and converts them into an electrical signal, mechanical vibration error signal 116".

Figure 2:
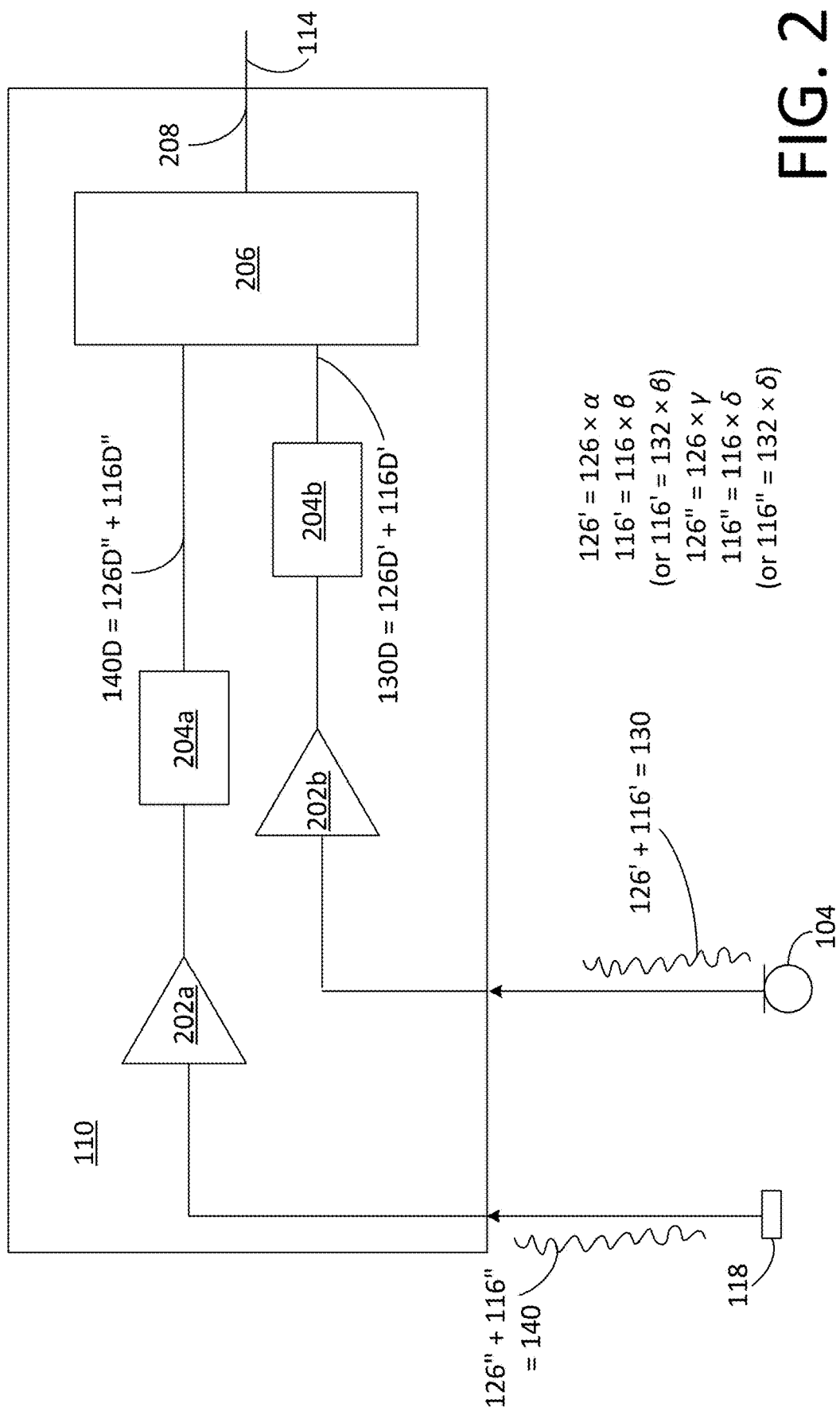
FIG. 2 illustrates a detailed view of the processor of FIG. 1, and other components of FIG. 1, according to aspects of the embodiments.

Attention is now directed towards FIG. 2, which illustrates a detailed view of processor 110, and other portions of FIG. 1. According to further aspects of the embodiments, processor 110 receives MVS output signal 140 at first receiver/amplifier/filter (amplifier) 202a. Those of skill in the art can appreciate that the device referred to as 202a can be any one of the aforementioned items, any two, or all three combined, according to aspects of the embodiments. Following amplifier 202a there is first analog-to-digital converter (ADC) 204a, which creates a digitized version of MVS output signal 140, MVS output signal 140D, and which is a combination of input sound error signal 126" and mechanical vibration error signal 116" (in their digitized form, input sound error signal 126D" and mechanical vibration error signal 116D" at the output of ADC 204a).

Device 202a can comprise an analog line receiver, optimized to receive an expected signal level and bandwidth from MVS 118 according to aspects of the embodiments. In addition, device 202a can also comprise an amplifier adapted to amplify only signals within an audio frequency bandwidth, or subset of that bandwidth. Similarly, device 202a can also comprise a filter that passes only a certain, pre-specified bandwidth of signals, according to aspects of the embodiments. As those of skill in the art can appreciate, all or substantially all of the signal processing that occurs in processor 110 can be accomplished digitally; in that case, once the analog MVS output signal 140 is received in processor 110, ADC 204a would convert the analog signal to a digitized version first, and then the digitized version of MVS output signal 140 can be filtered, amplified, and prepared for further signal processing, as discussed below.

According to further aspects of the embodiments, processor 110 receives mic output signal 130 at second receiver/amplifier/filter (amplifier) 202b. Those of skill in the art can appreciate that the device referred to as 202b can be any one of the aforementioned items, any two, or all three combined, according to aspects of the embodiments. Following amplifier 202b there is second analog-to-digital converter (ADC) 204b, which creates a digitized version of mic output signal 130, mic output signal 130D, and which is a combination of input sound electrical signal 126' and mechanical vibration electrical signal 116' (in their digitized form, input sound electrical signal 126D' and mechanical vibration electrical signal 116D' at the output of ADC 204b).

Device 202a can comprise an analog line receiver, optimized to received an expected signal level and bandwidth from MVS 118 according to aspects of the embodiments. In addition, device 202a can also comprise an amplifier adapted to amply only signals within an audio frequency bandwidth, or subset of that bandwidth. Similarly, device 202a can also comprise a filter that passes only a certain, pre-specified bandwidth of signals, according to aspects of the embodiments. As those of skill in the art can appreciate, all or substantially all of the signal processing that occurs in processor 110 can be accomplished digitally; in that case, once the analog mic output signal 130 is received in processor 110, ADC 204b would convert the analog signal to a digitized version first, and then the digitized version of mic output signal 130 can be filtered, amplified, and prepared for further signal processing, as discussed below.

According to aspects of the embodiments, the output of MVS 118 is an electrical signal that represents the amount of vibration present on enclosure 128 resulting from loudspeaker 102 creating sounds 122, and from the effect of acoustic signals 126 that impact enclosure 128. Discussed briefly above were coefficients $\alpha$, $\beta$, $\gamma$, and $\delta$. While the presence of such complex coefficients might be intuitively understood by those having skill in the art, the determination thereof can be complex. By way on non-limiting example, a first manner can be the use of complex mathematical models. Such models can take into account the amplitude and frequency of the sounds generated by loudspeaker 102 (or a by a person/external speaker in the case of acoustic signals 126), the transferal of vibrations from loudspeaker 102 or acoustic signals 126 to enclosure 128, the rigidity and shape of enclosure 128, temperature, humidity, barometric pressure, and perhaps many other variables. According to further aspects of the embodiments, however, another means for determining the coefficients $\alpha$, $\beta$, $\gamma$, and $\delta$ is to calibrate each enclosure using a variety of test signals.

By way of non-limiting example, and according to further aspects of the embodiments, one means for determining $\alpha$, the coefficient that describes or characterizes the transfer of energy from an external sound source through mic 104, is to use an externally located loudspeaker, and generate one or more signals, of differing amplitude/frequency combinations, and measure the output of mic 104 through processor 110. Such signals can be discrete tones, or a signal that sweeps through different frequency ranges, and changes or maintains a constant amplitude or any combination of signal types/amplitudes/frequencies. Such signals can be sine waves, or a plurality of different types of waves (triangular/square/pulse, among others), or can be white or pink noise, as understood by those of skill in the art, and the like, among other types and kinds of signals. Processor 110 and/or an external computer can then compare the signal that was generated to the captured output of mic 104 and determine coefficient $\alpha$.

In a substantially similar manner, coefficient $\beta$, which is the coefficient that describes or characterizes the transfer of energy from loudspeaker 102 through MVS 118, can be determined by generating the same or different types of sound signals as described above in regard to the determination of coefficient $\alpha$, outputting the same from loudspeaker 102, and then the output of MVS 118 can be measured by processor 110. Processor 110 can then perform a Fourier analysis on digitized vibration error signal 116D" to determine its audio frequency content. Processor 110 and/or an external computer can then compare the signal that was generated to the captured output of MVS 118 and determine coefficient $\beta$.

According to further aspects of the embodiments, coefficients $\gamma$ and $\delta$ can be determined at the same time as coefficients $\alpha$ and $\delta$, or separately. That is, because coefficient $\gamma$ characterizes the effect of an external audio signal on MVS 118, when coefficient $\alpha$ is determined as described above, coefficient $\gamma$ can also be determined, in a substantially similar manner. Similarly, so too can coefficient $\delta$ be determined when coefficient $\beta$ is determined.

Figure 3:
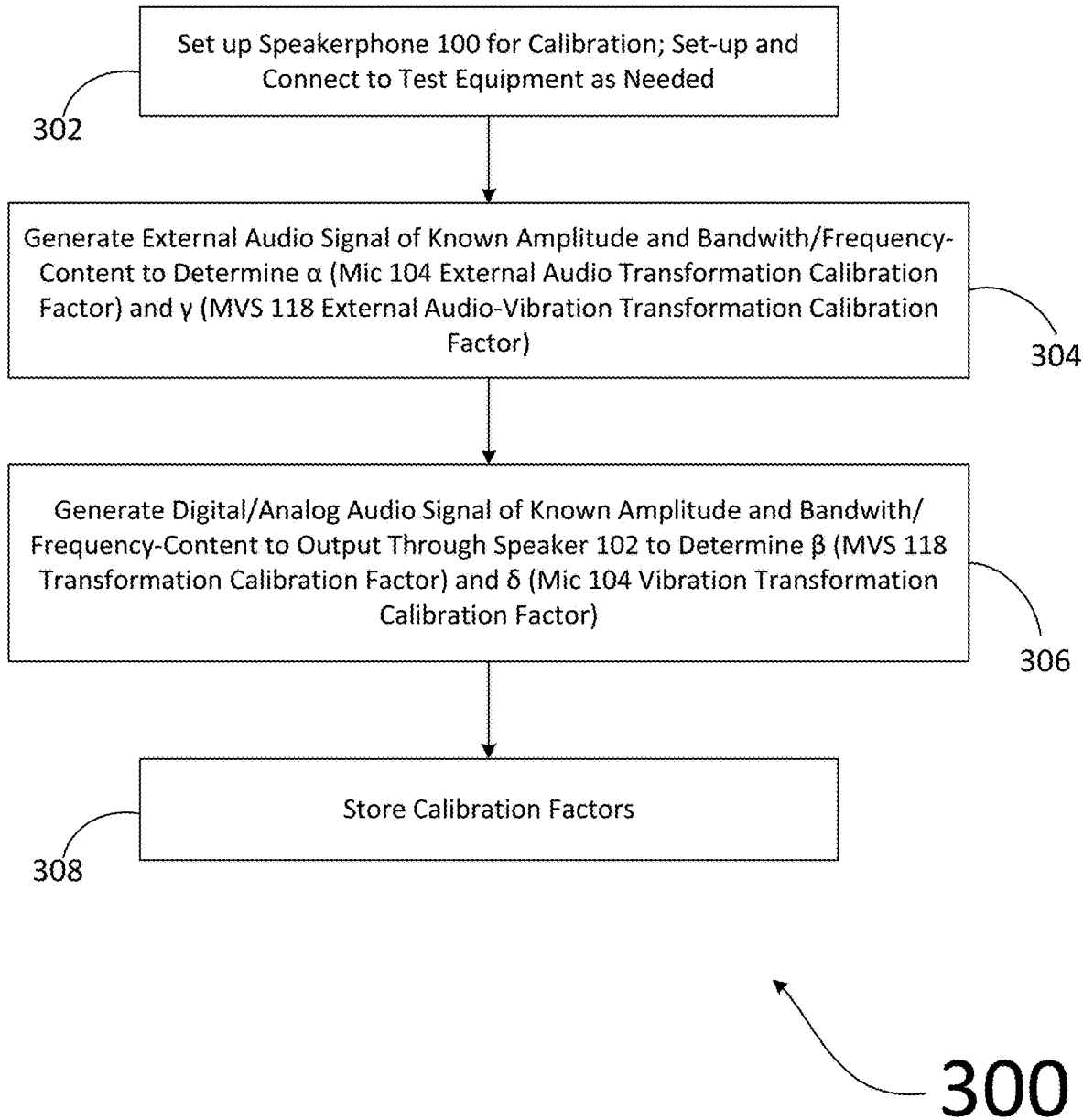
FIG. 3 illustrates a flowchart of a method for calibrating the speakerphone as shown in FIGS. 1 and 2 according to aspects of the embodiments.

Attention is now directed to FIG. 3, which illustrates method 300 for calibrating speakerphone 100 according to aspects of the embodiments. Method 300 begins with method step 302, in which a user sets up the calibration system. According to aspects of the embodiments, one non-limiting example of a calibration system can include an audio signal generator, with one or more stored audio signals. Such stored audio signals can be digital and/or analog signals, and can have a constant and/or adjustable amplitude and/or frequency content. Such signals can include white noise signals, pink noise signals, signals of a single or multiple tones, or certain bandwidths, or can include swept frequency signals, among other types. Such audio test signals can be generated and administered by a computer controlled test set, or can be manually controlled, or any combination thereof. The calibration system can further include one or more speakers to generate the audio test signals that calibrates mic 104 and MVS 118 according to aspects of the embodiments. The calibration system can further include a network interface that can be connected via an appropriate cable to DSP 206 via cable 114, so that the calibration system can generate an audio test signal to be broadcast from loudspeaker 102 in speakerphone 100. The audio test signal generated to be broadcast from loudspeaker 102 can be of the same type to be generated to test mic 104 according to aspects of the embodiments. In addition, through network cable 114, the calibration system can determine the calibration factors, store the same in internal memory (not shown) associated with DSP 206, or can store the same in a central server (not shown) that can be accessed by speakerphone 100, and the calibration system can perform the calculations needed to generate the calibration factors.

In method step 304, which follows method step 302, method 300 and the calibration system generates an external audio signal as described above that can be used to determine calibration factors α and γ. Calibration factor α can be used to calibrate mic 104 when input acoustic sound signals 126 are received by mic 104 and input sound electrical signal 126' is generated, and calibration factor γ can be used to calibrate MVS 118 when input acoustic sound signals 126 are received by MVS 118 and input acoustic error signal 126" is generated according to aspects of the embodiments.

Following method step 304 method 300 proceeds to method step 306, in which method 300 and the calibration system generate an audio signal to be broadcast by loudspeaker 102 according to aspects of the embodiments. When this test audio signal is broadcast, using an audio signal as described above, calibration factors β and δ can be determined. Calibration factor β can be used to calibrate mic 104 when vibrations 116 are received by mic 104 and mechanical vibration electrical signal 116' is generated, and calibration factor δ can be used to calibrate MCS 118 when vibrations 116 are received by MVS 118 and mechanical vibration error signal 116" is generated according to aspects of the embodiments. Following method steps 304 and 306 (which are interchangeable), method 300 and the calibration system can store the calibration factors in a manner as described above.

According to aspects of the embodiments, there are many different methods for determining each of the calibration coefficients α, β, γ, and δ, and different methods can be used for different coefficients. According to further aspects of the embodiments, the calibration coefficients themselves can be of a single, fixed, constant value, or can comprises a series of coefficients for use across an audio bandwidth. By way of non-limiting example, and not to be taken in a limiting or exclusive manner, a calibration factor can be determined by comparing the output signal from mic 104, or MVS 118, to the signal that generated the output of mic 104, or MVS 118 on a sub-band basis of the audio band being used. For example, the output signal can be compared to the input signal from $f_1$ to $f_2$, then $f_2$ to $f_3$, and so on, for the entire audio bandwidth. The calibration coefficient, therefore, would be a series of coefficients that is then applied against the same bands of frequencies in use. In determining the coefficient, the responses output from the device in question, mic 104 and MVS 118, can be compared to the input signal on smaller frequency increments, and then the values averaged, the median value taken, or mean, or other methods can be used.

Figure 7:
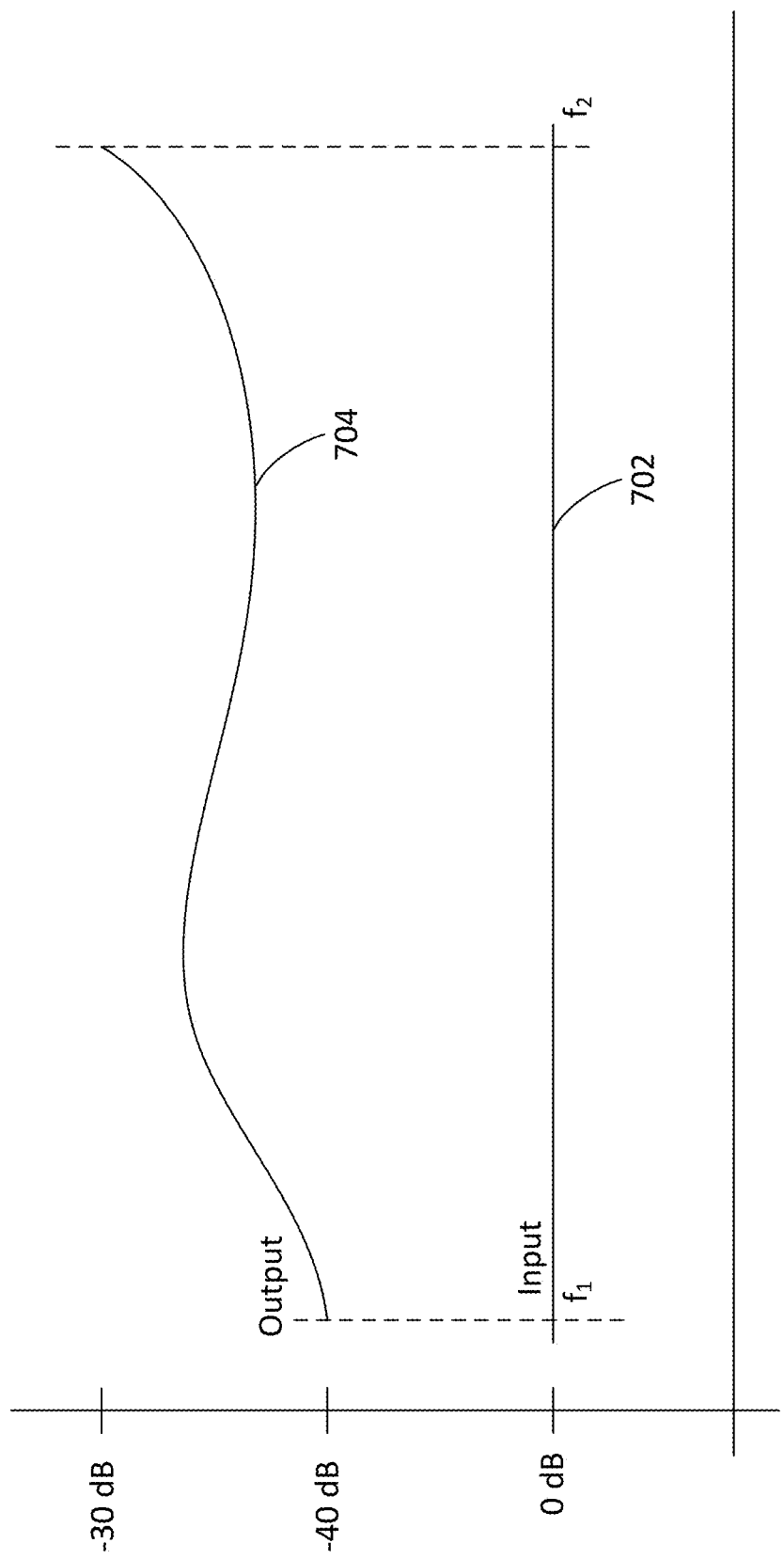
FIG. 7 illustrates an example of an output from a device on the speakerphone system in view of a test input signal that created such output signal to determine one or more calibration coefficients.

Attention is directed to FIG. 7, which, for purposes of illustration only for this discussion, shows an example of an output from a mic/MVS in view of an input signal that created such output signal. Line 702 replicates the input signal, across the audio bandwidth; it is generated at a 0 dB level. Line 704 illustrates an output signal from, by way of non-limiting example, MVS 118; line 704 is non-linear and ranges from −40 dB to −30 dB across the first sub-bandwidth being viewed. Thus, it can be seen that the calibration coefficient needs to take into account a "noise" signal that ranges from −40 dB to −30 dB in this particular bandwidth. According to aspects of the embodiments, the calibration factor for this sub-band of the audio bandwidth, can be a mid-band value (about −35 dB), an average of the endpoints, (40+30)/2=−35 dB, a mean or median value, or generated through some other manner of statistical analysis.

According to aspects of the embodiments, following calibration, there are at least several methods of generating speakerphone output signal 208 that take into account vibrations 116.

A. The first manner to determine speakerphone output signal 208 that takes into account vibrations 116 is to ignore the calibration factors, and the effect of vibrations on mic 104 and audio on MVS 118. That is, in this case, the effect of mechanical vibrations electrical signal 116' is ignored. In this simplified case, the output of MVS 118 (MVS output signal 140), once converted into an electrical signal, is subtracted from the output of mic 104 (mic output signal 130). This then is Equation 5:

$$\text{Speakerphone Output Signal } 208a = 130 - 140. \quad \text{Eq. 5:}$$

B. According to aspects of the embodiments, a second, less simplified method of determining speakerphone output signal 208b is to take into account several of the calibration factors, those in regard to the spoken audio signals generated by users in proximity to speakerphone 100, and vibration signals 116. In this case, and using Equation 2' and substituting that for 116', Equation 5 then becomes—

$$\text{Speakphone Output Signal } 208b = \frac{(130 - \beta 132) - 140}{\alpha} \quad \text{Eq. 6}$$

wherein, α is the input-to-output transformation coefficient for acoustic sound signals in regard to the mic 104, and β is the transformation coefficient from far end audio signal 132 input to loudspeaker 102 to the output of mic 104, mechanical vibration electrical signal 116'. By measuring mic output signal 130, and subtracting from it β132 and MVS output signal 140, and dividing by α, the output of speakerphone 100 can approximate very closely input sound acoustic signal 126 and delete the influences of vibrations 116. According to further aspects of the embodiments, other calculations are possible.

According to aspects of the embodiments, MVS 118 can be embodied as one or more discrete accelerometers, a MEMS integrated accelerometer, or another mic 104b. According to further aspects of the embodiments, a plurality of MVSs 118 can be located about enclosure 128 and their outputs averaged and then subtracted from digitized input sound signal 126D', which can be generated by an average of a plurality of mics 104.

Figure 4:
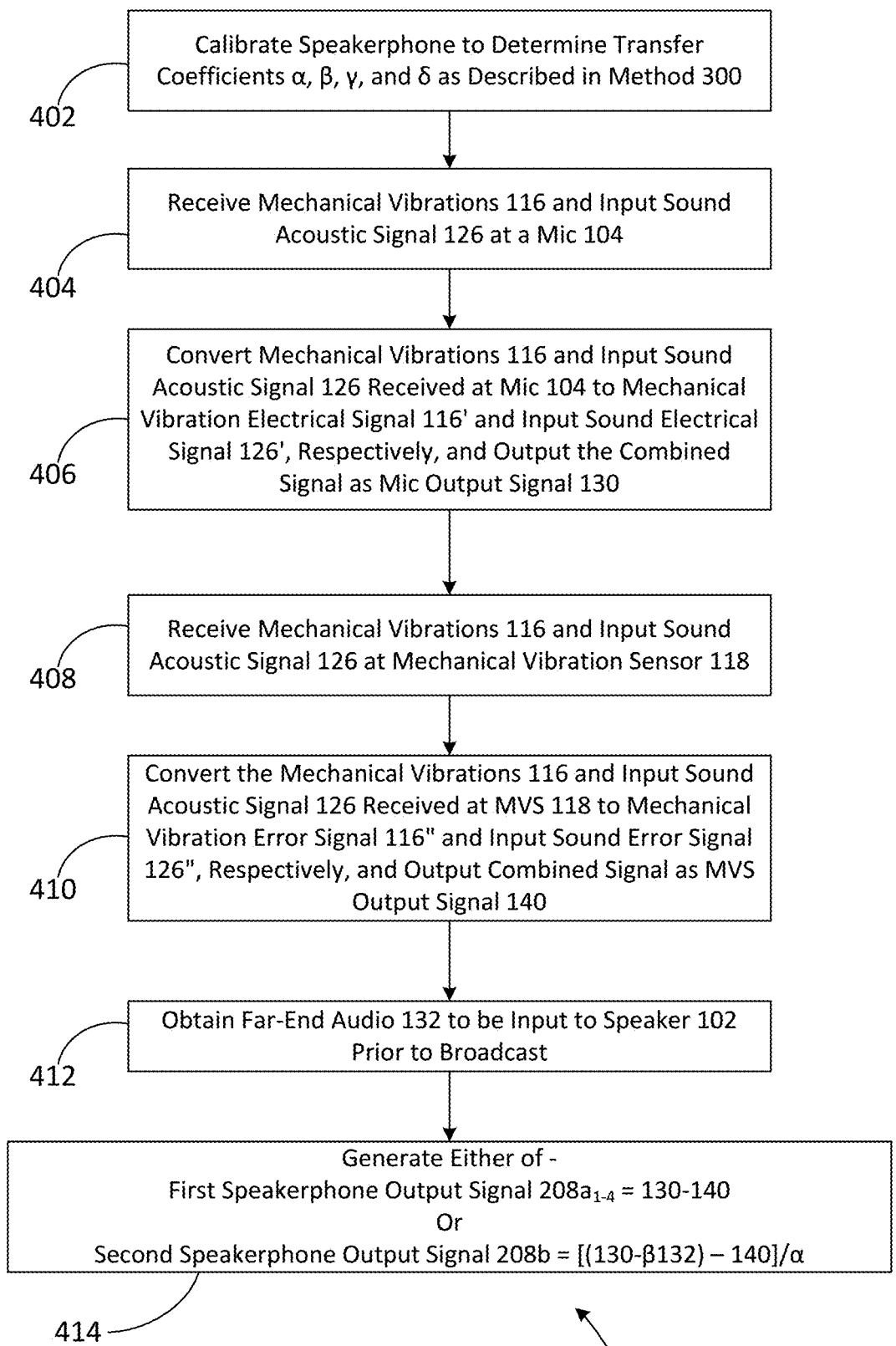
FIG. 4 illustrates a flowchart of a method for using the speakerphone as shown in FIGS. 1 and 2 according to aspects of the embodiments.

Attention is now directed towards FIG. 4, which illustrates a flow chart of method 400 for substantially eliminating the effects of mechanical loudspeaker vibrations in a speakerphone system according to aspects of the embodiments. Method 400 begins with optional method step 402 in which calibration can be performed, as described above in regard to Method 300, to generate the transfer coefficients α, β, γ, and δ, in the manner as described above.

In method step 404 vibrations 116 and input sound acoustic signal 126 are received at mic 104, and in method step 406, vibrations 116 and input sound acoustic signal 126 are converted to input sound electrical signal 126' and mechanical vibration electrical signal 116', respectively. The two signals 126' and 116' can be combined and output as mic output signal 130. According to aspects of the embodiments, in method steps 404 and 406, the effect of vibrations 116 can be ignored or determined to be negligible, and in this case, mic output signal 130 becomes input sound electrical signal 126'.

In method step 408 vibrations 116 and input sound acoustic signal 126 are received at MVS 118, and in method step 410, vibrations 116 and input sound acoustic signal 126 are converted to input sound error signal 126" and mechanical vibration error signal 116", respectively. The two signals 126" and 116" can be combined and output as MVS output signal 140. According to aspects of the embodiments, in method steps 408 and 410, the effect of input sound acoustic signal 126 can be ignored or determined to be negligible, and in this case, MVS output signal 140 becomes vibration error signal 116".

In optional method step 412, method 400/system 100 can obtain far end audio signal 132. As discussed above, audio signal 132, in conjunction with calibration factor $\beta$, can be used in place of vibration signal 116, as audio signal 132 creates the vibrations that originate from loudspeaker 102.

In method step 414, according to aspects of the embodiments, method 400 generates either of first speakerphone output signal 208a, or second speakerphone output signal 208b, according to either of Equations (5) or (6).

According to aspects of the embodiments, there are at least four methods for determining speakerphone output signal 208.

As discussed above, it can be the case that method 400/system 100 neglects the contributions of vibrations on the output of mic 104 and neglects the contributions of input acoustic audio signal 126 on the output of MVS 118; in this first case, therefore, first speakerphone output signal 208a is determined by subtracting MVS output signal 140 from mic output signal 130, or $208a_1=130-140=126'-116"$. First speakerphone output signal $208a_1$ can then be sent to one or more far end speakerphones (not shown in the Figures), according to aspects of the embodiments.

According to further aspects of the embodiments, and as discussed above, it can be the case that method 400/system 100 includes the contributions of vibrations on the output of mic 104 but neglects the contributions of input acoustic audio signal 126 on the output of MVS 118; in this second case, therefore, first speakerphone output signal 208a is again determined by subtracting MVS output signal 140 from mic output signal 130, but in a different manner: $208a_2=130-140=126'+116'-116"$. First speakerphone output signal $208a_2$ can then be sent to one or more far end speakerphones (not shown in the Figures), according to aspects of the embodiments.

According to further aspects of the embodiments, and as discussed above, it can be the case that method 400/system 100 neglects the contributions of vibrations on the output of mic 104 but includes the contributions of input acoustic audio signal 126 on the output of MVS 118; in this third case, therefore, first speakerphone output signal 208a is again determined by subtracting MVS output signal 140 from mic output signal 130, but in a different manner: $208a_3=130-140=126'-(116"+126")$. First speakerphone output signal $208a_3$ can then be sent to one or more far end speakerphones (not shown in the Figures), according to aspects of the embodiments.

According to still further aspects of the embodiments, and as discussed above, it can be the case that method 400/system 100 includes both the contributions of vibrations on the output of mic 104 and the contributions of input acoustic audio signal 126 on the output of MVS 118; in this fourth case, therefore, first speakerphone output signal 208a is again determined by subtracting MVS output signal 140 from mic output signal 130, but in a different manner: $208a_4=130-140=(126'+116')-(116"+126")$. First speakerphone output signal $208a_4$ can then be sent to one or more far end speakerphones (not shown in the Figures), according to aspects of the embodiments.

According to still further aspects of the embodiments, in any of the four methods described above in regard to first speakerphone output 208a ($208a_1$, $208a_2$, $208a_3$, and $208a_4$), one or more of the calibration factors $\alpha$, $\beta$, $\gamma$, and $\delta$, can be used on their respective corresponding signals if calibration is performed beforehand.

Alternatively, according to further aspects of the embodiments, in method step 410 method 400 can generate second speakerphone output signal 208b, according to Equation (6), which takes into account calibration coefficients $\alpha$ and $\beta$ that can be determined in regard to method 300, described above. To determine second speakerphone output signal 208b, method 400 performs the following equation: $208b=[(130-\beta132)-140]/\alpha$, where signal 132 is the audio signal to be output by loudspeaker 102 (i.e., far end audio signal 132). In the determination of second speakerphone output signal 208b, the calculation of $(130-\beta132)$ essentially isolates input audio electrical signal 126' from mic output signal 130, as the product of $\beta132$ is essentially the same as mechanical vibration electrical signal 116'. Subtracting MVS output signal 140 eliminates the influence of both types of vibrations as determined by MVS 118, and dividing by the transfer coefficient $\alpha$ yields, in essence, input audio acoustic signal 126, which the audio signal as received by mic 104. As those of skill in the art can appreciate, however, the determination of transfer coefficients can be less than perfect and therefore second speakerphone output signal 208b, as with all of the variations of first speakerphone output signal $208a_{1-4}$ is not a perfect rendition of input acoustic audio signal 126, but a very good improvement and substantially close approximation. Second speakerphone output signal 208b can then be sent to one or more far end speakerphones (not shown in the Figures), according to aspects of the embodiments.

Figure 5A:
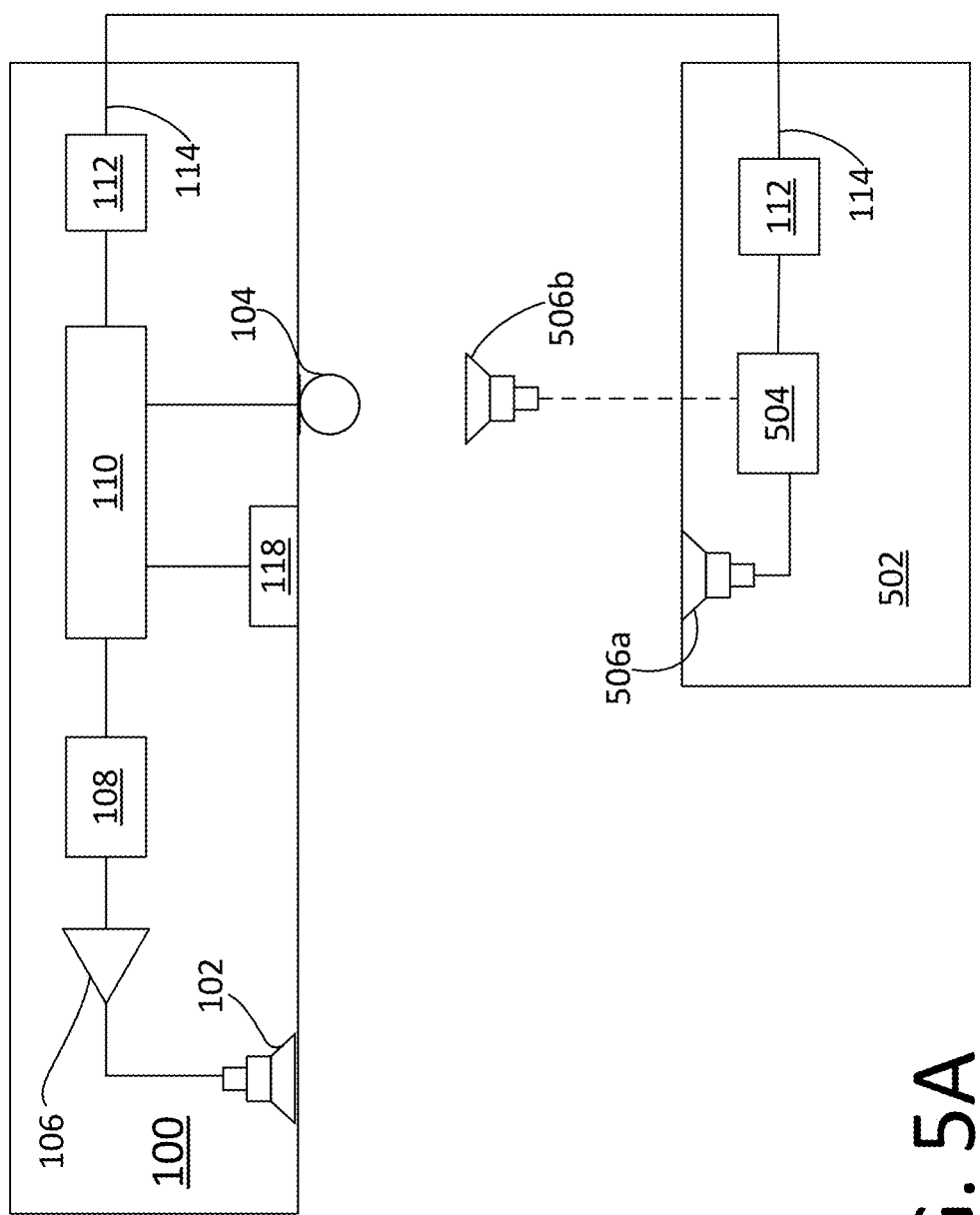
FIGS. 5A and 5B illustrates a first and second calibration setup for calibrating the Speakerphone of FIGS. 1 and 2 according to aspects of the embodiments.
Figure 5B:
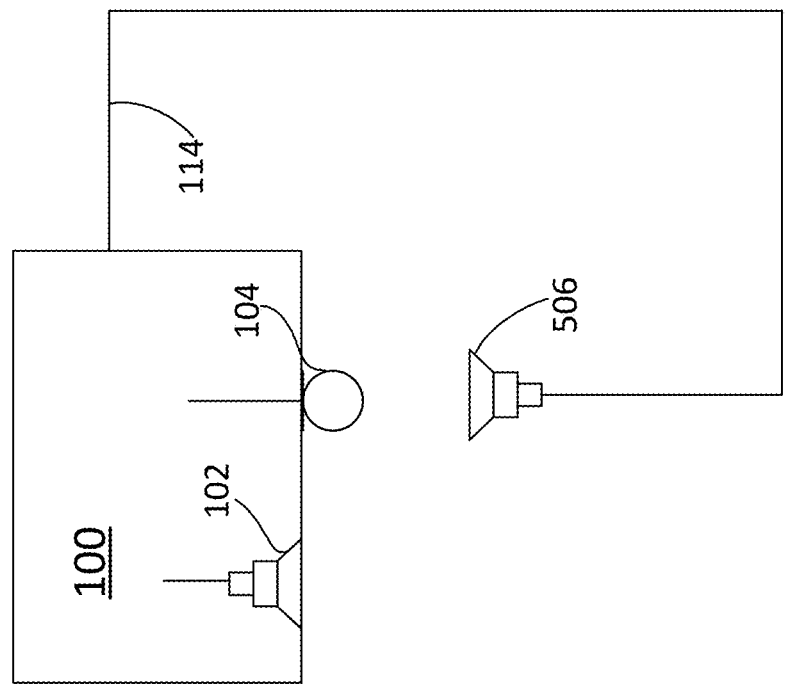

FIGS. 5A and 5B illustrates first calibration system 500, and a second calibration setup, respectively, for calibrating speakerphone 100 of FIGS. 1 and 2 according to aspects of the embodiments. In FIG. 5A there is shown speakerphone 100 connected to calibration unit 502 via network cable 114; As those of skill in the art can appreciate, speakerphone 100 can be connected to a speakerphone network (discussed in regard to FIG. 6, below), or another speakerphone directly, or to calibration unit 502, all through separate network cables 114, simultaneously, if needed. Calibration unit 502 includes calibration processor/memory device (processor) 504; processor 504 includes memory that can store the calibration factors $\alpha$, $\beta$, $\gamma$, and $\delta$ as described above, as well as digital waveforms that can be converted to analog signals to be broadcast by calibration speakers 506a,b to determine such calibration factors. In addition, processor 504 can store the algorithms that can be used to calculate the calibration factors. Loudspeaker 506a and loudspeaker 506b are substantially similar except that loudspeaker 506b can be remotely located, and the programmable/stored waveform can be transmitted to it either through a wired/wireless connection, as indicated by the dashed line. In either case, the waveform can be transmitted as an analog or digital signal, and the requisite circuitry can be located in loudspeaker 506b needed to either receive and demodulate a wirelessly transmitted analog/digital signal, or to receive, via a hard wire, the waveform and again demodulate and/or amplify the waveform signal. In addition, calibration unit 502 and processor 504 can store a digital waveform that can be transmitted to speakerphone 100 which will receive it, convert it to an analog signal, and then broadcast through loudspeaker 102, in the manner as described above, to create vibrations 116 that result in vibration electrical signal 116' from mic 104 or vibration error signal 116" from MVS 118 (note that the vibrations and related signals are shown in FIG. 1, and not shown in either of FIG. 5A or 5B), according to aspects of the embodiments.

FIG. 5B illustrates a second calibration setup for calibrating speakerphone 100 of FIGS. 1 and 2 according to aspects of the embodiments. In FIG. 5B there is no separate calibration unit, but instead additional software/applications can be provided in processor 110 that provides substantially similar capabilities as was discussed above in regard to processor 504 and calibration unit 502 in regard to storing waveforms, and generating test signals. According to further aspects of the embodiments, however, the unit in FIG. 5B can broadcast a waveform to test mic 102 and MVS 118 (not shown) through either loudspeaker 102, or a second, separate loudspeaker 506 that is connector to processor 110 (not shown) via network cable 114. As those of skill in the art can appreciate, communications between speakerphone 100 and calibration unit 502 (FIG. 5A) and/or loudspeaker 506 (FIG. 5B) can be via network cable 114, or a separate dedicated line, or wirelessly, according to aspects of the embodiments.

Figure 6:
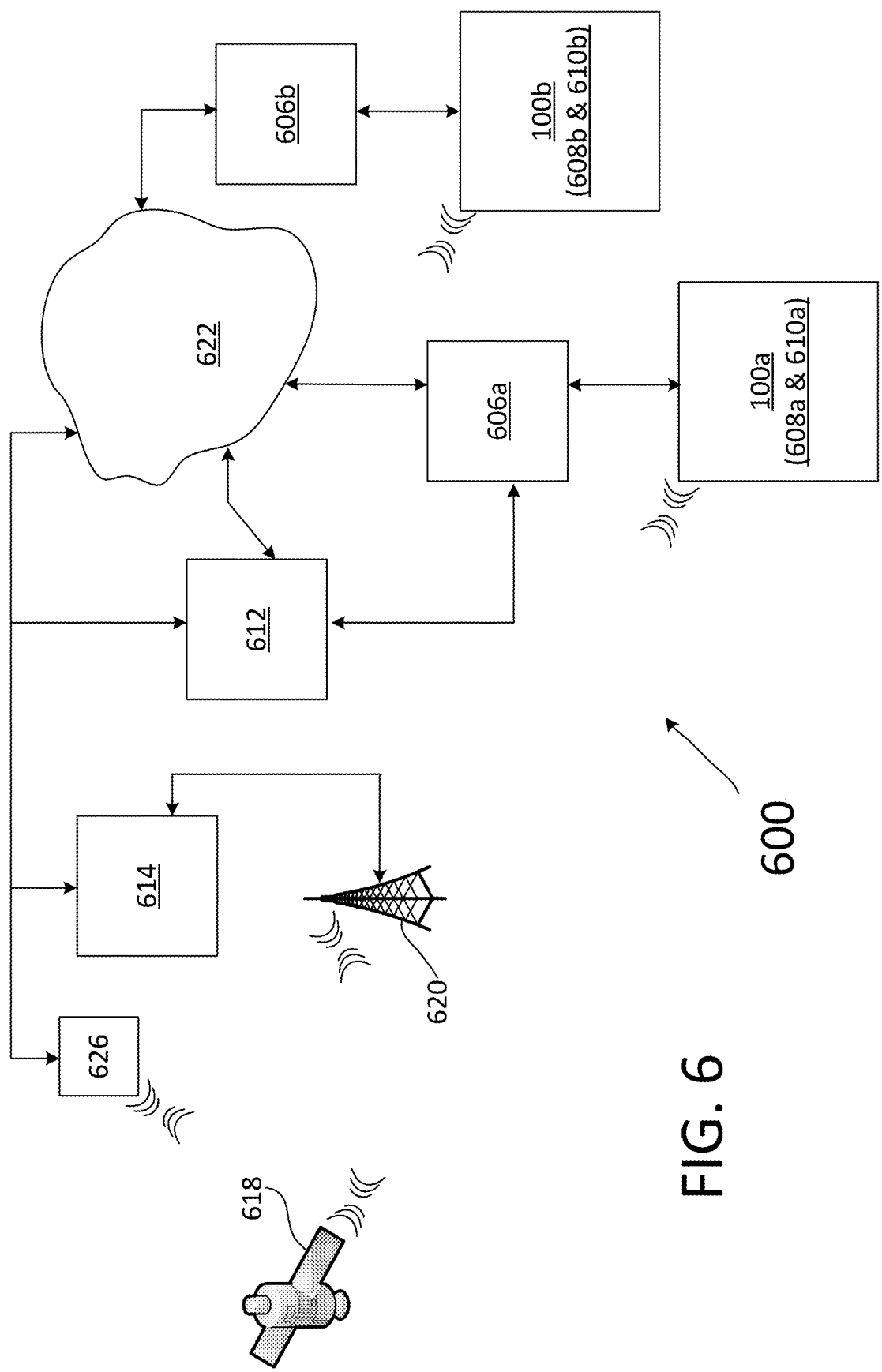
FIG. 6 illustrates a speakerphone network in which two or more speakerphones as shown in FIGS. 1 and 2 can bi-directionally communicate with each other according to aspects of the embodiments.

FIG. 6 illustrates a speakerphone network in which two or more speakerphones as shown in FIGS. 1 and 2 can bi-directionally communicate with each other according to aspects of the embodiments.

FIG. 6 illustrates network system 600 within which the system and method for operating speakerphone 100 with increased mechanical vibration noise immunity operating in a communications networks can be implemented according to aspects of the embodiments. Much of the network system infrastructure shown in FIG. 6 is or should be known to those of skill in the art, so, in fulfillment of the dual purposes of clarity and brevity, a detailed discussion thereof shall be omitted.

According to aspects of the embodiments, a user of speakerphone system 100 can operate the same within network system 600. Network system 600 comprises two or more speakerphones 100a,b, each of which can incorporate the functionality of modem 608 and router 610, the latter of which can be wired and/or wireless. According to further aspects of the embodiments, speakerphone 100 can access cellular service provider 614, either through a wireless connection (cellular tower 620) or via a wireless/wired interconnection (a "Wi-Fi" system that comprises, e.g., modulator/demodulator (modem) 608, wireless router 610, internet service provider (ISP) 606, and internet 622). Further, speakerphone system 100 can include near field communications (NFC), "Wi-Fi," and Bluetooth (BT) communications capabilities as well, all of which are known to those of skill in the art. Modem 608 can be connected to ISP 606 to provide internet based communications in the appropriate format to end users (e.g., speakerphone system 100), and which takes signals from the end users and forwards them to ISP 606. Such communication pathways are well known and understand by those of skill in the art, and a further detailed discussion thereof is therefore unnecessary.

Speakerphone system 100 can also access communication satellites 618 and their respective satellite communication systems control stations 626 for near-universal communications capabilities, albeit at a much higher cost than convention "terrestrial" cellular services. Speakerphone system 100 can also make use of the different communication systems using plain old telephone service (POTS) provider 612.

The disclosed embodiments provide a system, software, and a method for substantially or completely eliminating mechanical vibration energy from the loudspeaker that is converted to acoustical signals that can be acquired by a microphone as an error signal in the speakerphone. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

All United States patents and applications, foreign patents, and publications discussed above are hereby incorporated herein by reference in their entireties.

INDUSTRIAL APPLICABILITY

To solve the aforementioned problems, the aspects of the embodiments are directed towards systems, methods, and modes for substantially or completely eliminating mechanical vibration energy from the loudspeaker that is converted to acoustical signals that can be acquired by a microphone as an error signal in the speakerphone.

ALTERNATE EMBODIMENTS

Alternate embodiments may be devised without departing from the spirit or the scope of the different aspects of the embodiments.

What is claimed is:

1. A method for calibrating a speakerphone system under test, comprising:
  connecting a calibration unit to the speakerphone system under test (SSUT) via a communications interface, and wherein the SSUT further comprises a loudspeaker, microphone (mic), and mechanical vibration sensor (MVS);
  generating a first test signal by the calibration unit and transmitting the same to the SSUT;
  generating a first set of mechanical vibrations in response to the first test signal in the SSUT; and determining a calibration factor in regard to the first test signal and first set of mechanical vibrations by the calibration unit.

2. The method according to claim 1, wherein the step of determining a calibration factor in regard to the first test signal and first set of mechanical vibrations by the calibration unit comprises:
  receiving the first test signal at the SSUT, and processing the same;
  generating a first audio signal based on the first test signal, and then outputting the same to the loudspeaker;
  broadcasting a first acoustic signal by the loudspeaker, wherein the broadcast first acoustic signal generates the first set of mechanical vibrations on an enclosure of the SSUT;
  receiving the first set of mechanical vibrations at the MVS;
  converting the first set of mechanical vibrations by the MVS into a first MVS electrical signal; and
  generating an input-to-output transformation coefficient for mechanical vibration signals generated by the loudspeaker in regard to the MVS (calibration factor δ), wherein the calibration factor δ is based on a comparison between the first test signal and the first MVS electrical signal.

3. The method according to claim 2, wherein the step of generating the calibration factor δ comprises:
  receiving the first MVS electrical signal at the calibration unit;
  comparing the first MVS electrical signal with the first test signal; and
  generating the calibration factor δ based on the results of the comparison.

4. The method according to claim 3, wherein the step of comparing comprises:
  comparing the first MVS electrical signal and the first test signal on the basis of frequency versus amplitude; and
  determining the calibration factor δ as a function of amplitude versus frequency.

5. The method according to claim 4, wherein the step of determining the calibration factor δ comprises:
  determining a difference between the first MVS electrical signal and the first test signal wherein
    the calibration factor δ comprises a set of discrete amplitude factors at predetermined frequency points, such that the amplitude factors can be multiplied against a new output of the MVS at the predetermined frequency points.

6. The method according to claim 1, wherein the step of determining a calibration factor in regard to the first test signal and first set of mechanical vibrations by the calibration unit comprises:
  receiving the first test signal at the SSUT, and processing the same;
  generating a first audio signal based on the first test signal, and then outputting the same to the loudspeaker;
  broadcasting a first acoustic signal by the loudspeaker, wherein the broadcast first acoustic signal generates the first set of mechanical vibrations on an enclosure of the SSUT;
  receiving the first set of mechanical vibrations at the mic;
  converting the first set of mechanical vibrations by the mic into a first mic electrical signal; and
  generating an input-to-output transformation coefficient for mechanical vibration signals generated by the loudspeaker in regard to the mic (calibration factor β), wherein the calibration factor β is based on a comparison between the first test signal and the first mic electrical signal.

7. The method according to claim 6, wherein the step of generating the calibration factor β comprises:
  receiving the first mic electrical signal at the calibration unit;
  comparing the first mic electrical signal with the first test signal; and
  generating the calibration factor β based on the results of the comparison.

8. The method according to claim 7, wherein the step of comparing comprises:
  comparing the first mic electrical signal and the first test signal on the basis of frequency versus amplitude; and
  determining the calibration factor β as a function of amplitude versus frequency.

9. The method according to claim 8, wherein the step of determining the calibration factor comprises:
  determining a difference between the first mic electrical signal and the first test signal wherein
    the calibration factor β comprises a set of discrete amplitude factors at predetermined frequency points, such that the amplitude factors can be multiplied against a new output of the mic at the predetermined frequency points.

10. A method for calibrating a speakerphone system under test, comprising;
  connecting a calibration unit to the speakerphone system under test (SSUT) via a communications interface, wherein
    the SSUT further comprises a microphone (mic), and mechanical vibration sensor (MVS), and wherein
    the calibration unit further comprises a calibration loudspeaker;
  generating a first test signal by the calibration unit and transmitting the same to the calibration loudspeaker;
  broadcasting a first acoustic audio test signal by the calibration loudspeaker;
  generating a first set of mechanical vibrations in response to the first acoustic audio test signal in the SSUT; and
  determining a calibration factor in regard to the first test signal and first set of mechanical vibrations by the calibration unit.

11. The method according to claim 10, wherein the step of determining a calibration factor in regard to the first test signal and first set of mechanical vibrations by the calibration unit comprises:
  receiving the first acoustic audio test signal at the SSUT, and generating the first set of mechanical vibrations on an enclosure of the SSUT in response to the received first acoustic audio test signal;
  receiving the first set of mechanical vibrations at the MVS;
  converting the first set of mechanical vibrations by the MVS into a first MVS electrical signal; and
  generating an input-to-output transformation coefficient for mechanical vibration signals generated by the calibration loudspeaker in regard to the MVS (calibration factor γ), wherein the calibration factor γ is based on a comparison between the first test signal and the first MVS electrical signal.

12. The method according to claim 11, wherein the step of generating the calibration factor γ comprises:
  receiving the first MVS electrical signal at the calibration unit;

comparing the first MVS electrical signal with the first test signal; and generating the calibration factor $\gamma$ based on the results of the comparison.

13. The method according to claim 12, wherein the step of comparing comprises:

comparing the first MVS electrical signal and the first test signal on the basis of frequency versus amplitude; and determining the calibration factor $\delta$ as a function of amplitude versus frequency.

14. The method according to claim 13, wherein the step of determining the calibration factor $\delta$ comprises:

determining a difference between the first MVS electrical signal and the first test signal wherein the calibration factor $\delta$ comprises a set of discrete amplitude factors at predetermined frequency points, such that the amplitude factors can be multiplied against a new output of the MVS at the predetermined frequency points.

15. The method according to claim 10, wherein the step of determining a calibration factor in regard to the first test signal and first set of mechanical vibrations by the calibration unit comprises:

receiving the first acoustic audio test signal at the SSUT, and generating the first set of mechanical vibrations on an enclosure of the SSUT in response to the received first acoustic audio test signal;

receiving the first set of mechanical vibrations at the mic;

converting the first set of mechanical vibrations by the mic into a first mic electrical signal; and generating an input-to-output transformation coefficient for mechanical vibration signals generated by the calibration loudspeaker in regard to the mic (calibration factor $\alpha$), wherein the calibration factor $\alpha$ is based on a comparison between the first test signal and the first mic electrical signal.

16. The method according to claim 15, wherein the step of generating the calibration factor $\alpha$ comprises:

receiving the first mic electrical signal at the calibration unit;

comparing the first mic electrical signal with the first test signal; and generating the calibration factor $\alpha$ based on the results of the comparison.

17. The method according to claim 16, wherein the step of comparing comprises:

comparing the first mic electrical signal and the first test signal on the basis of frequency versus amplitude; and determining the calibration factor $\alpha$ as a function of amplitude versus frequency.

18. The method according to claim 17, wherein the step of determining the calibration factor comprises:

determining a difference between the first mic electrical signal and the first test signal wherein the calibration factor $\alpha$ comprises a set of discrete amplitude factors at predetermined frequency points, such that the amplitude factors can be multiplied against a new output of the mic at the predetermined frequency points.

* * * * *